United States Patent
Wu et al.

(10) Patent No.: US 10,796,620 B2
(45) Date of Patent: Oct. 6, 2020

(54) DISPLAY PANEL AND DISPLAY DEVICE

(71) Applicant: XIAMEN TIANMA MICRO-ELECTRONICS CO., LTD., Xiamen (CN)

(72) Inventors: Huangyao Wu, Xiamen (CN); Donghua Li, Xiamen (CN); Xiufeng Zhou, Xiamen (CN); Poping Shen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/221,610

(22) Filed: Dec. 17, 2018

(65) Prior Publication Data

US 2019/0122599 A1    Apr. 25, 2019

(30) Foreign Application Priority Data

Jun. 22, 2018 (CN) .......................... 2018 1 0652911

(51) Int. Cl.
*G09G 3/20* (2006.01)
*G09G 3/36* (2006.01)
*G02F 1/13* (2006.01)

(52) U.S. Cl.
CPC ............. *G09G 3/2003* (2013.01); *G02F 1/13* (2013.01); *G09G 3/3607* (2013.01);
(Continued)

(58) Field of Classification Search
None
See application file for complete search history.

(56) References Cited

U.S. PATENT DOCUMENTS

| 6,028,650 A | 2/2000 | Shoichi et al. |
| 2005/0052590 A1 | 3/2005 | Ochiai et al. |

(Continued)

FOREIGN PATENT DOCUMENTS

| CN | 102725681 A | 10/2012 |
| CN | 102770802 A | 11/2012 |

(Continued)

OTHER PUBLICATIONS

Office Action of Chinese Patent Application No, 201810652911.0 dated Aug. 4, 2020.

*Primary Examiner* — Ifedayo B Iluyomade
(74) *Attorney, Agent, or Firm* — Kilpatrick Townsend & Stockton, LLP

(57) ABSTRACT

A display panel and a display device are provided. The display panel includes multiple pixel units. In each of the pixel units, the area of an opening region of at least one sub-pixel is different from the area of an opening region of other sub-pixels. There is an adjustment capacitance between the drain of the thin film transistor and/or the first electrode in each sub-pixel and the scan line corresponding to the sub-pixel, and the sub-pixel having a smaller area of the opening region corresponds to a smaller value of the adjustment capacitance. By adjusting the value of the adjustment capacitance corresponding to the sub-pixels with different areas of opening regions, the optimal Vcom of all the sub-pixels is the same, so that all the sub-pixels operate under the same optimal Vcom.

19 Claims, 21 Drawing Sheets

(52) U.S. Cl.
CPC ... *G09G 3/3648* (2013.01); *G09G 2300/0426* (2013.01); *G09G 2300/0452* (2013.01); *G09G 2300/08* (2013.01); *G09G 2310/0267* (2013.01); *G09G 2320/0219* (2013.01); *G09G 2320/0666* (2013.01)

(56) References Cited

U.S. PATENT DOCUMENTS

| | | |
|---|---|---|
| 2005/0243230 A1 | 11/2005 | Chen |
| 2012/0274889 A1* | 11/2012 | Sugisaka ........... G02F 1/136213 349/139 |
| 2012/0306732 A1 | 12/2012 | Sugihara et al. |
| 2012/0320297 A1 | 12/2012 | Itsumi et al. |
| 2014/0285542 A1 | 9/2014 | Izumi et al. |
| 2018/0175204 A1* | 6/2018 | Wang .................. H01L 29/7869 |

FOREIGN PATENT DOCUMENTS

| | | |
|---|---|---|
| CN | 104078000 A | 10/2014 |
| CN | 205881358 U | 1/2017 |
| CN | 1591107 A | 12/2018 |
| JP | 1039328 A | 2/1998 |

\* cited by examiner

DISPLAY PANEL AND DISPLAY DEVICE

CROSS REFERENCE TO RELATED APPLICATION

The present application claims priority to Chinese Patent Application No. 201810652911.0, titled "DISPLAY PANEL AND DISPLAY DEVICE", filed on Jun. 22, 2018 with the State Intellectual Property Office of the People's Republic of China, which is incorporated herein by reference in its entirety.

FIELD

The present disclosure relates to the field of display, and particularly to a display panel and a display device.

BACKGROUND

The RGBW technology is to form an RGBW pixel structure by adding a white sub-pixel on the basis of the traditional RGB (red, green, blue) pixel structure. A display panel with four-color sub-pixels is formed by adding white (W) sub-pixels to the traditional RGB pixel arrangement consisting of red (R), green (G), and blue (B) sub-pixels, so as to image by corresponding sub-pixel rendering techniques. Since the backlight may be illuminated by the white sub-pixel (W) without being blocked by the close arrangement of the red sub-pixel (R), the green sub-pixel (G) and the blue sub-pixel (B), compared to the design of the RGB three-color sub-pixels, the design of the four-color sub-pixels leads to higher resolution and higher light transmittance. Therefore, the liquid crystal display panel with the RGBW pixel structure has advantages of high light transmittance, high brightness, low energy consumption, and rich colors.

In the RGBW structure, generally, the opening region of each of the red sub-pixel (R), the green sub-pixel (G), and the blue sub-pixel (B) is larger than the opening region of the white sub-pixel (W). The difference in the opening region causes the difference in storage capacitance formed by the pixel electrode and the common electrode. The difference in storage capacitor causes difference in the feed through voltage, which further result in that different common electrode voltages Vcom are required to be applied to the thin film transistors in the sub-pixels having different opening regions. However, when configuring the display panel, only one optimal Vcom can be configured. When sub-pixels with different storage capacitances use the same optimal Vcom, some sub-pixels work at their optimal Vcom, while other sub-pixels do not work at their optimal common electrode voltages. Therefore, the other sub-pixels inevitably flicker, resulting in poor electrical stability of the display panel and the display device.

SUMMARY

In view of this, a display panel and a display device are provided in the present disclosure, to solve the problem of poorer electrical stability of the display panel and the display device due to the inevitable flickering of some sub-pixels under the same common electrode voltage Vcom caused by different storage capacitances of sub-pixels having different areas of opening regions.

A display panel includes a substrate, and multiple scan lines and multiple data lines located on the substrate. The multiple scan lines intersect and are insulated from the multiple data lines, to define multiple sub-pixels in a matrix. Multiple adjacent sub-pixels form a pixel unit. Each of the sub-pixels includes an opening region. Each of the sub-pixels is connected to a thin film transistor, and each thin film transistor is connected to one of the scan lines.

The thin film transistor includes: a gate connected to the scan line, a drain and a source on a side of the gate facing away from the substrate.

Each of the sub-pixels includes a first electrode located on a side of the thin film transistor facing away from the substrate, the first electrode being electrically connected to the drain.

In each pixel unit, the area of the opening region of at least one sub-pixel is different from the area of the opening region of other sub-pixels.

An adjustment capacitance exists between the drain and a corresponding scan line, and/or an adjustment capacitance exists between the first electrode and a corresponding scan line.

The sub-pixel having a smaller opening region corresponds to a smaller adjustment capacitance.

In some embodiments, the display panel according to the present disclosure includes multiple pixel units. In each of the pixel units, the area of an opening region of at least one sub-pixel is different from the area of an opening region of other sub-pixels. There is an adjustment capacitance between the drain of the thin film transistor and/or the first electrode in each sub-pixel and the scan line corresponding to the sub-pixel, and the sub-pixel having a smaller opening region corresponds to a smaller adjustment capacitance. By adjusting the values of the adjustment capacitances corresponding to the sub-pixels with different areas of opening regions, the optimal Vcom of all the sub-pixels is the same, so that all the sub-pixels operate under the same optimal Vcom, improving the electrical stability of the display panel, so as to make no sub-pixel flicker, thereby improving the display effect of the display panel.

In the present disclosure, a display device including the above-described display panel is also provided, which may also improve the electrical stability of the display device, to have better display effect.

BRIEF DESCRIPTION OF THE DRAWINGS

Embodiments of the present disclosure will be presented, in the following, drawings in the description of the embodiments will be introduced simply. Apparently, the drawings in the following description show only embodiments of the present disclosure.

DETAILED DESCRIPTION

As described in the background section, in the conventional technology, the values of the optimal common electrode voltages Vcom of the sub-pixels having different areas of opening regions are different, and the display panel or the display device can only have one common electrode voltage Vcom, thereby causing the situation that some sub-pixels inevitably flicker while other sub-pixels do not flicker.

Figure 1:
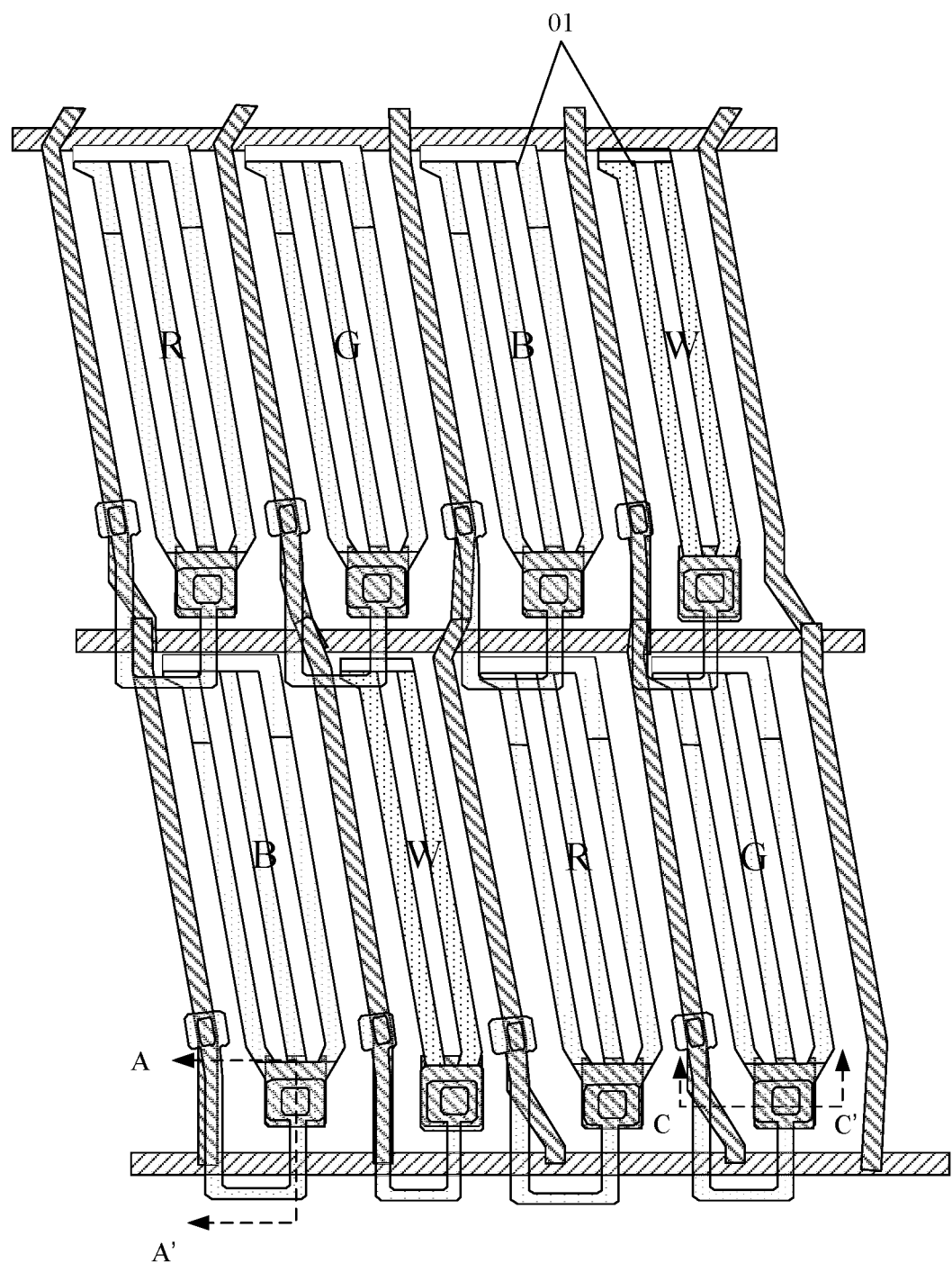
FIG. 1 is a schematic diagram of a display panel having a RGBW pixel structure in the conventional technology.
Figure 2:
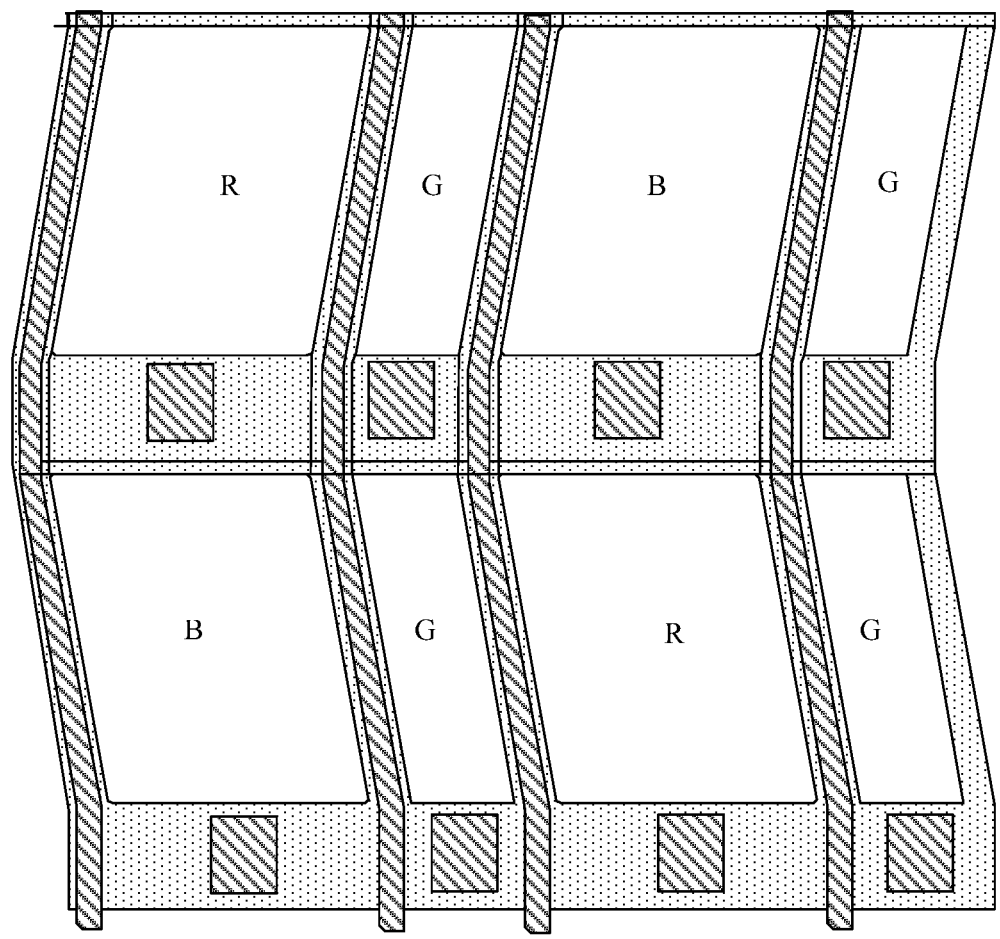
FIG. 2 is a schematic diagram of a display panel having a RGRG pixel structure in the conventional technology.

It is found that, as shown in FIG. 1, which is a schematic diagram of a display panel having an RGBW pixel structure in the conventional technology, or as shown in FIG. 2, which is a schematic diagram of a display panel having an RGRG pixel structure in the conventional technology, the areas of the opening regions of multiple sub-pixels are not the same due to requirements on the brightness.

Taking the RGBW pixel structure as an example, as shown in FIG. 1, since the white sub-pixel (W) is usually formed by three colors of RGB, the white sub-pixel contains multiple colors. When displaying a monochromatic color, for example, when displaying red, since the white sub-pixel contains green and blue, the white sub-pixel area will display both of green and blue, instead of only red. In order to avoid large deviation of the color gamut during monochrome display, the pixel electrode of the white sub-pixel is usually made small, so that the area of the opening region is small, hence having less impact on the display of other colors.

Figure 3:
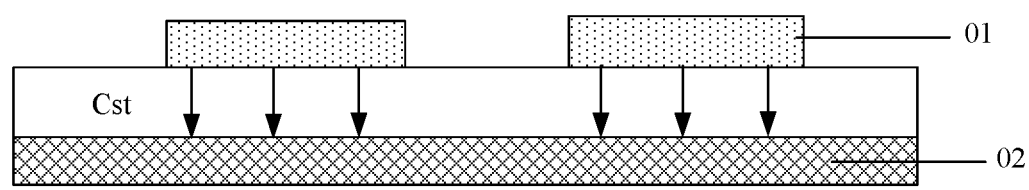
FIG. 3 is a schematic structural diagram for illustrating a principle of forming a storage capacitance between a pixel electrode and a common electrode.

However, since the area of the opening region of the white sub-pixel W is small, as shown in FIG. 1, the number of the pixel electrodes 01 is relatively small. As shown in FIG. 3, which is a schematic structural diagram for illustrating a principle of forming a storage capacitance between a pixel electrode and a common electrode, since the number of the pixel electrodes 01 is small, the storage capacitance Cst formed between the pixel electrode 01 corresponding to the white sub-pixel and the common electrode 02 is smaller than the storage capacitance corresponding to other sub-pixel (R, G or B) having a large area of the opening region and a large number of the pixel electrodes.

Figure 4:
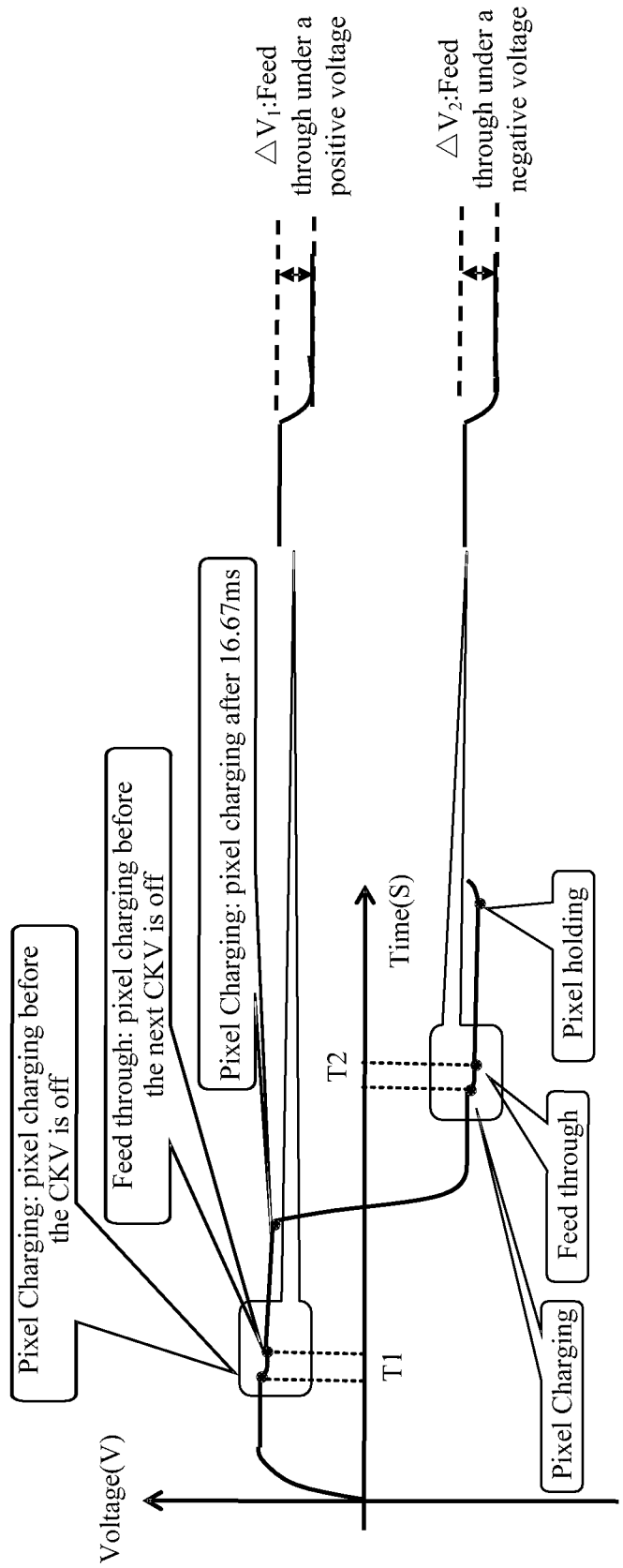
FIG. 4 is a diagram showing pixel voltages in cases of a positive frame display and a negative frame display in a process of pixel display.

In the pixel display process, a positive frame display and a negative frame display are implemented by applying a positive voltage and a negative voltage on a gate. FIG. 4 shows pixel voltages when displaying a positive frame and a negative frame during a process of pixel display, in which the abscissa represents time, and the ordinate represents the pixel voltage. When the signal on the gate line is off, due to the action of Cpg (the capacitance between the drain of the thin film transistor and/or a pixel electrode and a gate line), in the feed through phase T1, the pixel voltage charged positively will be feed through downward (e.g. a previous 5V is feed through down to 4.8V), and thus the change of voltage due to the feed through is $\Delta V1=0.2V$. In the feed through phase T2, the pixel voltage charged negatively will also be feed through downward (e.g. a previous −5V is coupled down to −5.2V), and thus the change of voltage due to the feed through is $\Delta V2=0.2V$. The optimal voltage Vcom applied to the common electrode is the middle value between the positive and negative voltages after the feed through (without considering the penetration of the liquid crystal of the positive and negative frames), that is, Vcom= $(\Delta V2-\Delta V1)/2$, that is, Vcom(4.8−5.2)/2=−0.2.

According to the voltage coupling formula (charge conservation):

$$\Delta V = \Delta Vgate*(Cpg+Ctft)/(Cpg+Ctft+Cpd+ \ldots +Cst)$$

Figure 5:
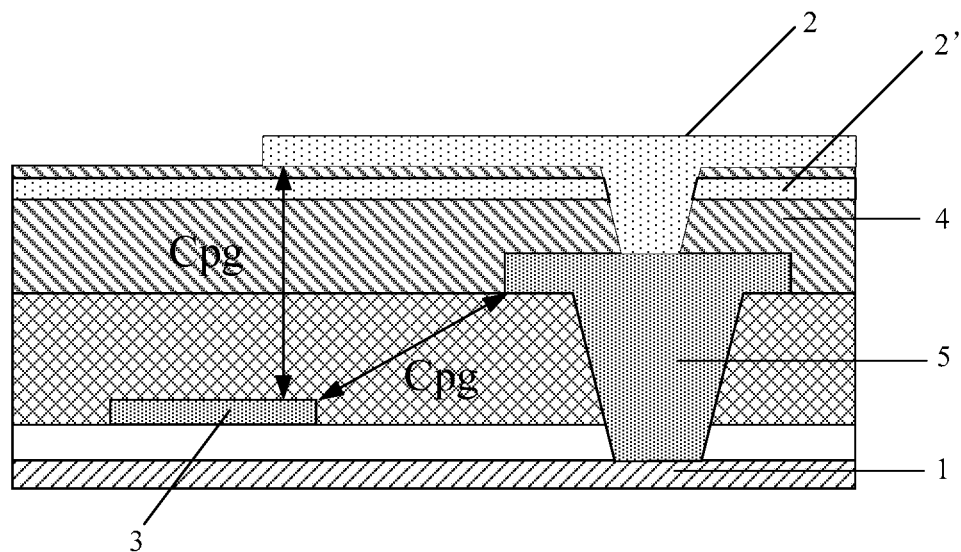
FIG. 5 is a cross-sectional view of a display panel according to an embodiment of the present disclosure.
Figure 6:
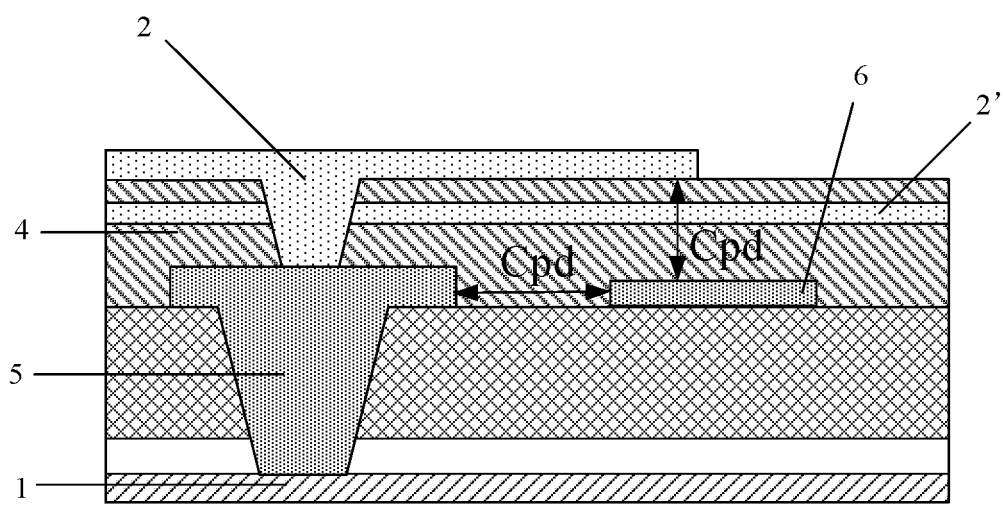
FIG. 6 is a cross-sectional view of a display panel in another direction according to an embodiment of the present disclosure.

In the formula, the scan line capacitance Cpg is a capacitance formed between a drain of the thin film transistor (TFT) and a scan line, or a capacitance formed between a pixel electrode and a scan line. FIG. 5 is a cross-sectional view of the array substrate along the direction perpendicular to the scan line (i.e., line AA' in FIG. 1), which includes a polysilicon substrate 1, a drain 5 of TFT connected to the polysilicon substrate 1, a pixel electrode 2 electrically connected to the drain 5, and a scan line 3. A planarization layer 4 is further included between the pixel electrode 2 and the drain 5. As shown in FIG. 5, a capacitance is formed between the drain 5 of TFT and the scan line 3, and a capacitance is also formed between the pixel electrode 2 and the scan line 3, which are both referred to as scan line capacitance Cpg in the present disclosure. The self-capacitance Ctft of TFT is mainly determined by the channel area of the TFT, which is determined by the design of the current Ion/Ioff of the TFT. The data line capacitance Cpd is the capacitance formed between a drain of the TFT and a data line, or the capacitance formed between a pixel electrode and a data line. FIG. 6 is a cross-sectional view of the array substrate along the direction perpendicular to the data line (i.e., line CC' in FIG. 1). A capacitance is formed between the drain 5 of TFT and the data line 6, and a capacitance is also formed between the pixel electrode 2 and the data line 6, which are both referred to as data line capacitance Cpd in the present disclosure. The storage capacitance Cst is the capacitance between the pixel electrode and the common electrode of the display panel, as shown in FIG. 3.

It can be seen that since the storage capacitances Cst of the sub-pixels are different, $\Delta V$ is different, which causes the optimal common electrode voltages Vcom of different sub-pixels to be different.

It is found that the common electrode voltage Vcom may be adjusted by adjusting the scan line capacitance Cpg. It is also found that the feed through pull-down to the pixel voltage of the sub-pixel having a larger storage capacitance Cst is smaller, and the feed through pull-down to the pixel voltage of the sub-pixel having a larger scan line capacitance Cpg is larger. Therefore, for a sub-pixel having a large storage capacitance Cst, since the coupling pull-down is small, ΔV is small. By increasing the scan line capacitance Cpg of the sub-pixel having a large opening region, the feed through pull-down to the pixel voltage is increased, so as to obtain a decreased common electrode voltage Vcom which is consistent with the common electrode voltage Vcom of the sub-pixel having a small storage capacitance Cst. Alternatively, by reducing the scan line capacitance Cpg of the sub-pixel having a small opening region, the feed through pull-down to the pixel voltage is decreased, so as to obtain an increased common electrode voltage Vcom which is consistent with the common electrode voltage Vcom of the sub-pixel having a large storage capacitance Cst.

Based on the above, a display panel is provided in the present disclosure, including a substrate, and multiple scan lines and multiple data lines located on the substrate. The multiple scan lines intersect and are insulated from the multiple data lines, to define multiple sub-pixels in a matrix. Multiple adjacent sub-pixels form a pixel unit. Each of the sub-pixels includes an opening region, and is connected to a thin film transistor. Each thin film transistor is connected to one of the scan lines.

The thin film transistor includes: a gate connected to the scan line, a drain and a source on a side of the gate facing away from the substrate.

Each of the sub-pixels includes a first electrode located on a side of the thin film transistor facing away from the substrate, the first electrode being electrically connected to the drain.

In each pixel unit, the area of the opening region of at least one sub-pixel is different from the area of the opening region of other sub-pixels.

An adjustment capacitance exists between the drain and a corresponding scan line, and/or an adjustment capacitance exists between the first electrode and a corresponding scan line.

The sub-pixel having a smaller opening region corresponds to a smaller adjustment capacitance.
The display panel according to the present disclosure includes multiple pixel units. In each of the pixel units, the area of an opening region of at least one sub-pixel is different from the area of an opening region of other sub-pixels. There is an adjustment capacitance between the drain of the thin film transistor and/or the first electrode in each sub-pixel and the scan line corresponding to the sub-pixel, and the sub-pixel having a smaller opening region corresponds to a smaller adjustment capacitance. By adjusting the values of the adjustment capacitances corresponding to the sub-pixels with different areas of opening regions such that the optimal Vcom of all the sub-pixels is the same, all the sub-pixels operate under the same optimal Vcom, improving the electrical stability of the display panel, so as to make no sub-pixel flicker, thereby improving the display effect of the display panel.

Figure 7:
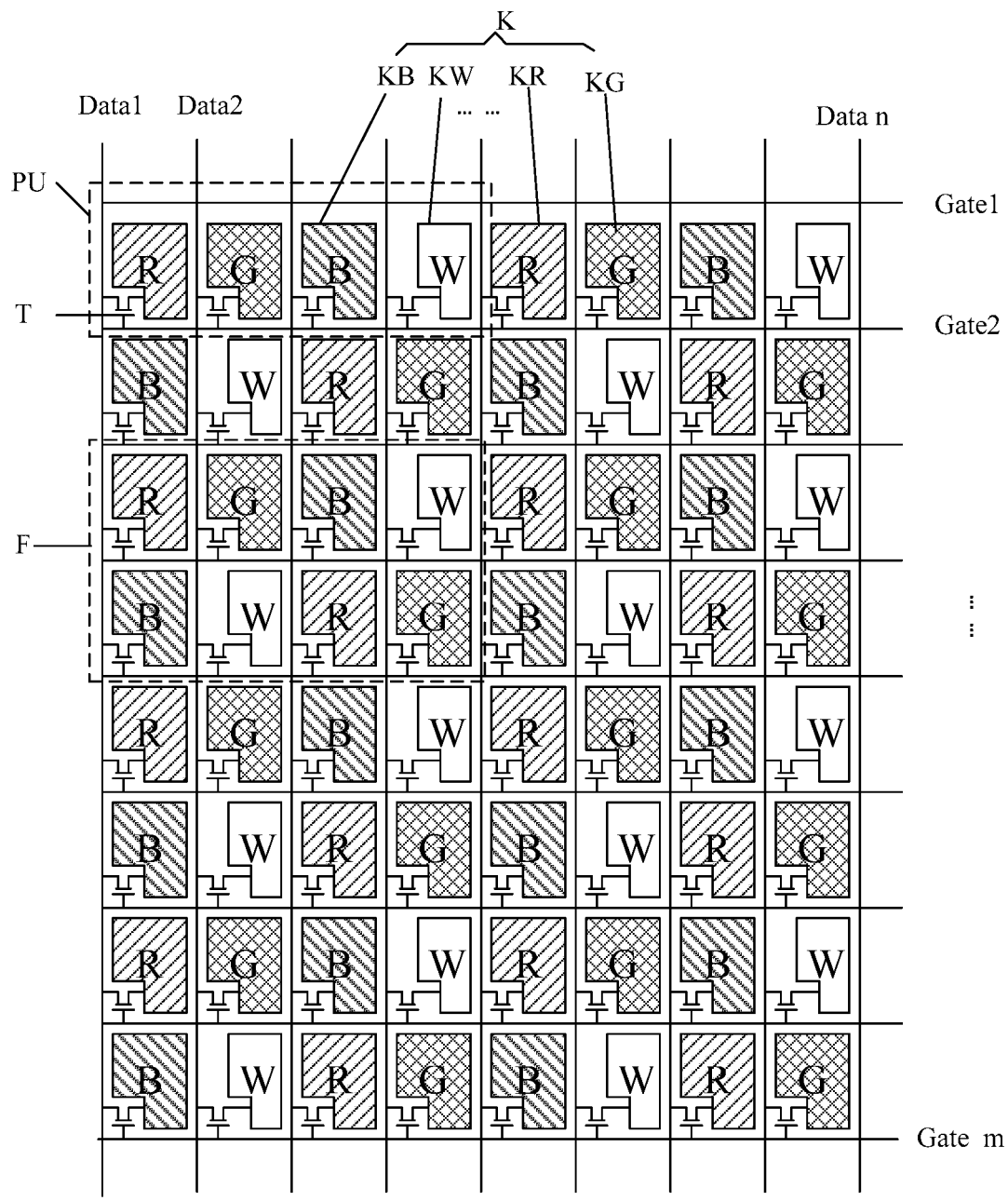
FIG. 7 is a schematic structural diagram of a display panel according to an embodiment of the present disclosure.
Figure 8:
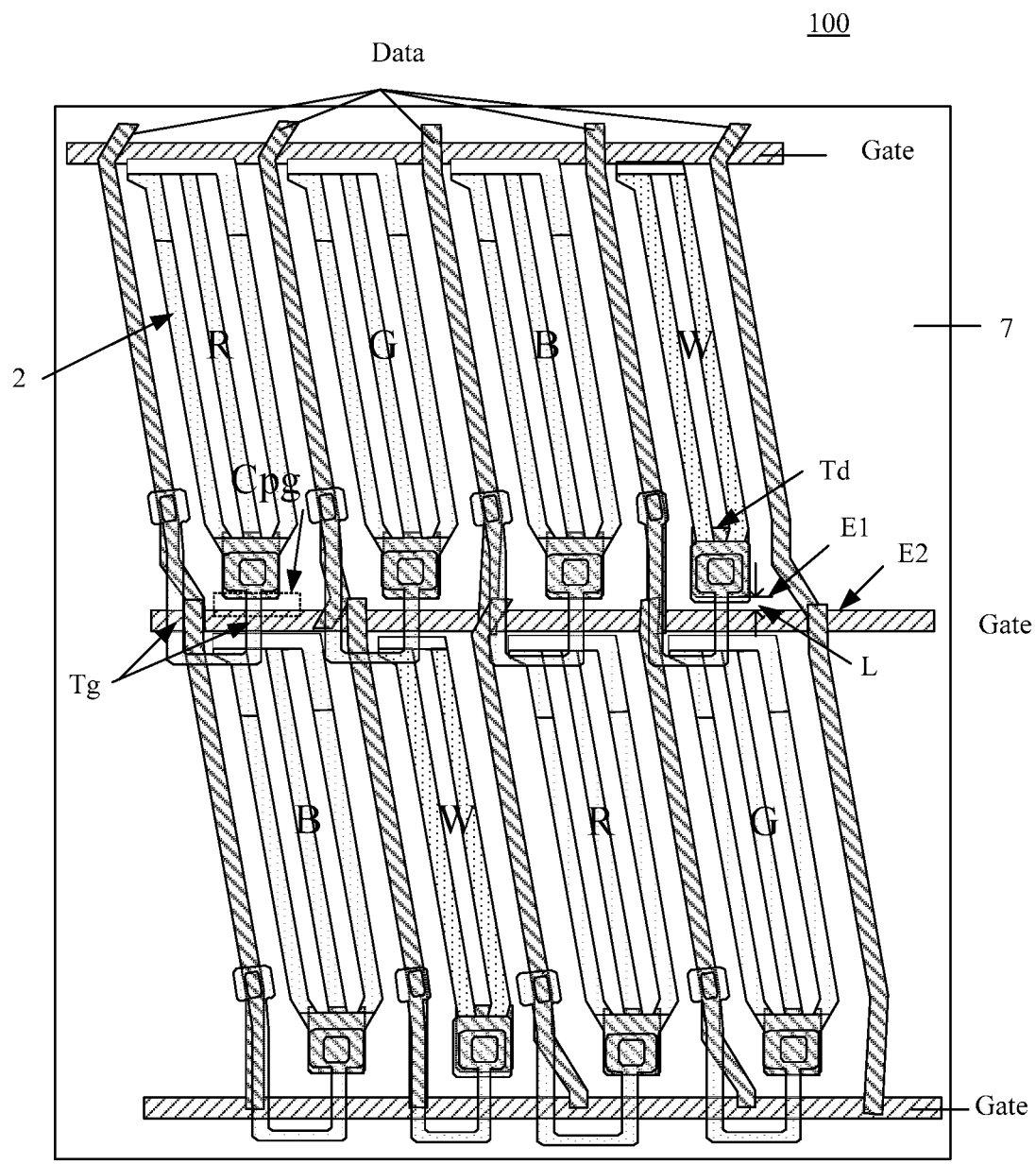
FIG. 8 is a partial enlarged view of a portion represented by F in FIG. 7.

FIG. 7 is a schematic structural diagram of a display panel according to an embodiment of the present disclosure, and FIG. 8 is a partial enlarged view of a portion represented by F in FIG. 7, Referring to FIG. 7 and FIG. 8, the display panel 100 includes a substrate 7, and multiple scan lines (Gate1, Gate2, . . . , Gate m) and multiple data lines (Data1, Data2, . . . Data n) located on the substrate 7. The multiple scan lines (Gate1, Gate2, . . . , Gate m) intersect and are insulated from the multiple data lines (Data1, Data2, . . . Data n), to define multiple sub-pixels (R, G, B, W) in a matrix. Multiple adjacent sub-pixels (R, G, B, W) forms a pixel unit PU. Each sub-pixel includes an opening region K, and is connected to a thin film transistor T. Each thin film transistor T is connected to one of the scan lines Gate.

The thin film transistor T includes a gate Tg connected to the scan line Gate, and a drain Td and a source (not shown) on the side of the gate Tg facing away from the substrate 7.

Each of the sub-pixels includes a first electrode 2 located on the side of the thin film transistor facing away from the substrate 7. The first electrode 2 is electrically connected to the drain Td.

Figure 9:
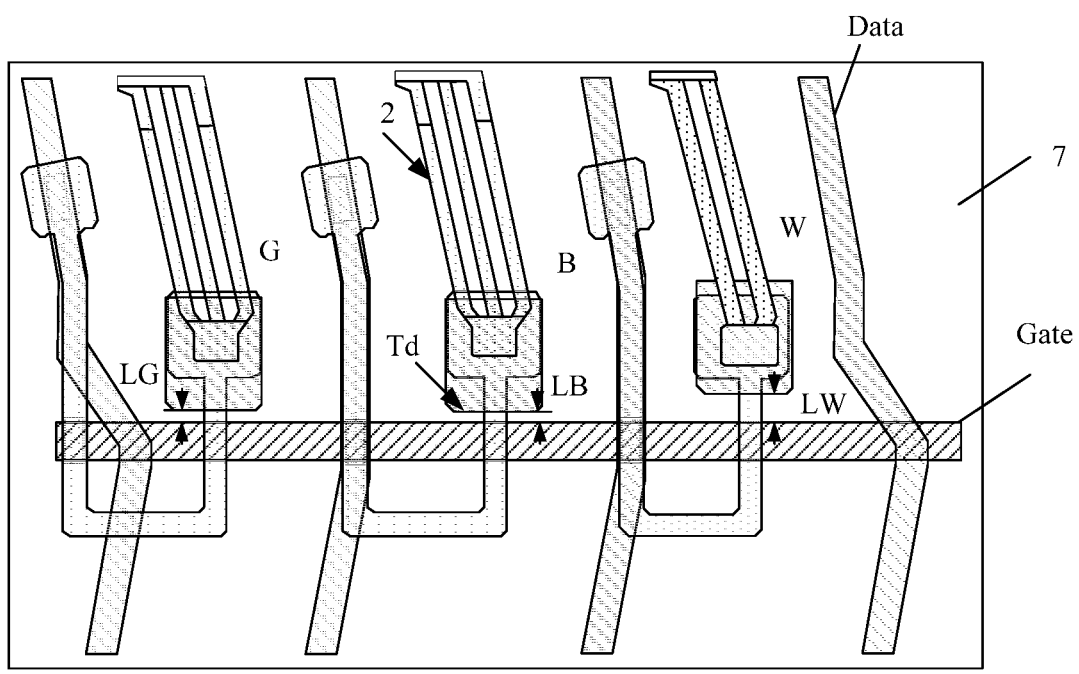
FIG. 9 is a partial schematic diagram of FIG. 8.

In each pixel unit PU, the area of the opening region of at least one of the sub-pixels is different from the area of the opening region of other sub-pixel. As shown in FIG. 8 and FIG. 9, the area KW of the opening region of the sub-pixel W is different from the areas (the area KR of the opening region of the sub-pixel R, the area KG of the opening region of the sub-pixel G, and the area KB of the opening region of the sub-pixel B) of the opening regions of other sub-pixels (the sub-pixel R, the sub-pixel B, and the sub-pixel G).

An adjustment capacitance Cpg (i.e., the aforementioned scan line capacitance) exists between the drain Td and/or the first electrode 2 and the corresponding scan line Gate.

The sub-pixel having a smaller opening region corresponds to a smaller adjustment capacitance. For example, the adjustment capacitance Cpg corresponding to the sub-pixel W is smaller than the adjustment capacitance Cpg corresponding to the sub-pixel R.

It should be noted that, in this embodiment, the different areas of the opening regions is different lead to different areas of the first electrodes 2. The first electrode 2 usually includes multiple strip electrodes. In a sub-pixel having a larger area of the opening region, the number of the first electrodes 2 is large. In the sub-pixel having a small opening region, the number of the first electrodes 2 is small. As shown in FIG. 8, the number of the first electrodes 2 of the white sub-pixel W is smaller than the number of the first electrodes 2 of the green sub-pixel G or the blue sub-pixel B.

The embodiment of the present disclosure does not limit the specific manner of changing the value of the adjustment capacitance. The adjustment capacitance may be formed between the drain of the thin film transistor corresponding to each sub-pixel and the corresponding scan line, or may be formed between the pixel electrode of each sub-pixel and the corresponding scan line. Therefore, the value of the adjustment capacitance may be changed in view of the above two aspects in different embodiments of the present disclosure.

Moreover, it should be noted that the drain, the first electrode and the scan line are located on different layers on the display panel. Therefore, when the projections of the drain and/or the first electrode overlap with the projection of the corresponding scan line on the substrate, the overlapping portion forms a plate capacitor. According to the principle that the capacitance of the plate capacitor is directly proportional to the area of the plate and inversely proportional to the distance between the plates, a large overlapping portion between projections of the drain and/or the first electrode and the projection of the corresponding scan line on the substrate indicates a large capacitance. Therefore, by adjusting the overlapping region between the drain and the scan line, or between the first electrode and the scan line, the adjustment capacitance can be adjusted. That is, the adjustment capacitance increases with an increase of the overlapping region, and decreases with a decrease of the overlapping region.

In addition, when there is no overlapping region between the projection of the drain or the first electrode and the projection of the corresponding scan line on the substrate, an edge capacitance is formed by the two metal layers, that is, the adjustment capacitance is an edge capacitance. The edge capacitance becomes small as the distance between the two metal layers becomes large. Therefore, the value of the capacitance may also be adjusted by adjusting the edge capacitance between the two metal layers.

In an embodiment of the present disclosure, as shown in FIG. 8, taking the sub-pixel W as an example, the projection of the drain Td does not overlap with the projection of the corresponding scan line Gate on the substrate 7. The projection of the drain Td on the substrate 7 has a first edge E1 on a side close to the corresponding scan line Gate. The projection of the scan line Gate on the substrate 7 has a second edge E2 on a side close to the drain Td. The distance between the first edge E1 and the second edge E2 is a first adjustment distance L. The sub-pixel having a smaller opening region corresponds to a greater first adjustment distance. As shown in FIG. 9, which is a partial schematic diagram of FIG. 8, the first adjustment distance LW of the white sub-pixel W is greater than the first adjustment distance of the sub-pixel having a larger opening region (e.g., the first adjustment distance LG of the green sub-pixel G or the first adjustment distance LB of the blue sub-pixel B). In this embodiment, the green sub-pixel G and the blue sub-pixel B have the same area of the opening region, and have the same first adjustment distance, that is, LG=LB.

That is, in the embodiment, by adjusting the first adjustment distance L, the edge capacitance between the drain of the sub-pixel having a small opening region and the corresponding scan line is smaller than the edge capacitance between the drain of the sub-pixel having a large opening region and the corresponding scan line, such that the sub-pixel having a large opening region and the sub-pixel having a small opening region have the same optimal common electrode voltage Vcom, thereby improving the electrical stability of all sub-pixels of the display panel and improving the display effect of the display panel.

It should be noted that, in this embodiment, the specific manner of adjusting the value of the first adjustment distance L is not limited, which may be implemented by adjusting the position of the scan line Gate, or by adjusting the position of the metal layer where the drain Td is located. If a position of the scan line of a single sub-pixel is moved, the position of the scan line of other sub-pixels in the same row is affected, so that the first adjustment distances of multiple sub-pixels have to be adjusted. In order to avoid this situation, in an embodiment, the value of the first adjustment distance is adjusted by moving the position of the metal layer where the drain of the sub-pixel is located.

In another embodiment of the present disclosure, there is an overlapping region between the projection of the drain and the projection of the corresponding scan line on the substrate. The area of the overlapping region of the sub-pixel having a smaller opening region corresponds to a smaller area of the overlapping region.

Figure 10:
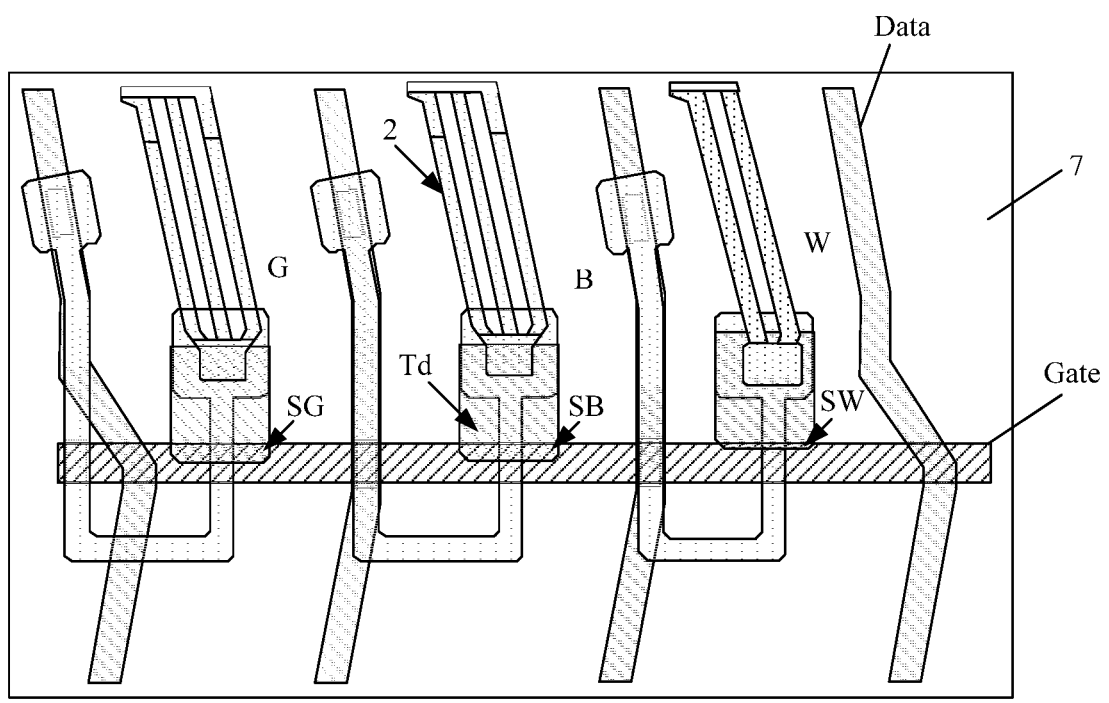
FIG. 10 is a schematic structural diagram of another display panel according to an embodiment of the present disclosure.

FIG. 10 is a schematic structural diagram of another display panel according to an embodiment of the present disclosure; As shown in FIG. 10, there is an overlapping region between the projection of the drain Td of each sub-pixel and the projection of the corresponding scan line Gate on the substrate 7, and the drain Td and the corresponding scan line Gate in the overlapping portion form a plate capacitor. As shown in FIG. 10, the RGBW pixel structure is taken as an example. The overlapping region of the sub-pixel having a small opening region, such as the overlapping region SW of the white sub-pixel W, is smaller than the overlapping region of the sub-pixel having a large opening region, such as the overlapping region SG or SB of the green sub-pixel G or blue sub-pixel B. In this embodiment, the green sub-pixel G and the blue sub-pixel B have the same area of the opening region, and have the same area of the overlapping region, that is, SG=SB.

That is, in the embodiment, by adjusting the value of the plate capacitance formed by the overlapping region, the plate capacitance between the drain of the sub-pixel having a small opening region and the corresponding scan line is smaller than the plate capacitor between the drain of the sub-pixel having a large opening region and the corresponding scan line, such that the sub-pixel having a large opening region has the same optimal common electrode voltage Vcom as the sub-pixel having a small opening region, thereby improving the electrical stability of all sub-pixels of the display panel and improving the display effect of the display panel.

It should be noted that the specific manner of adjusting the area of the overlapping region is not limited in the embodiment, which may be implemented by adjusting the position of the scan line, or by adjusting the position of the metal layer where the drain is located. If a position of the scan line of a single sub-pixel is moved, the position of the scan line of other sub-pixels in the same row is affected, so that the areas of the overlapping regions of multiple sub-pixels have to be adjusted. In order to avoid this situation, in an embodiment, the area of the overlapping region is adjusted by moving the position of the metal layer where the drain of the sub-pixel is located.

In another embodiment of the present disclosure, the same value of the optimal common electrode voltage Vcom of the sub-pixels having different areas of the opening regions may be achieved by adjusting the adjustment capacitance between the first electrode and the scan line.

Figure 11:
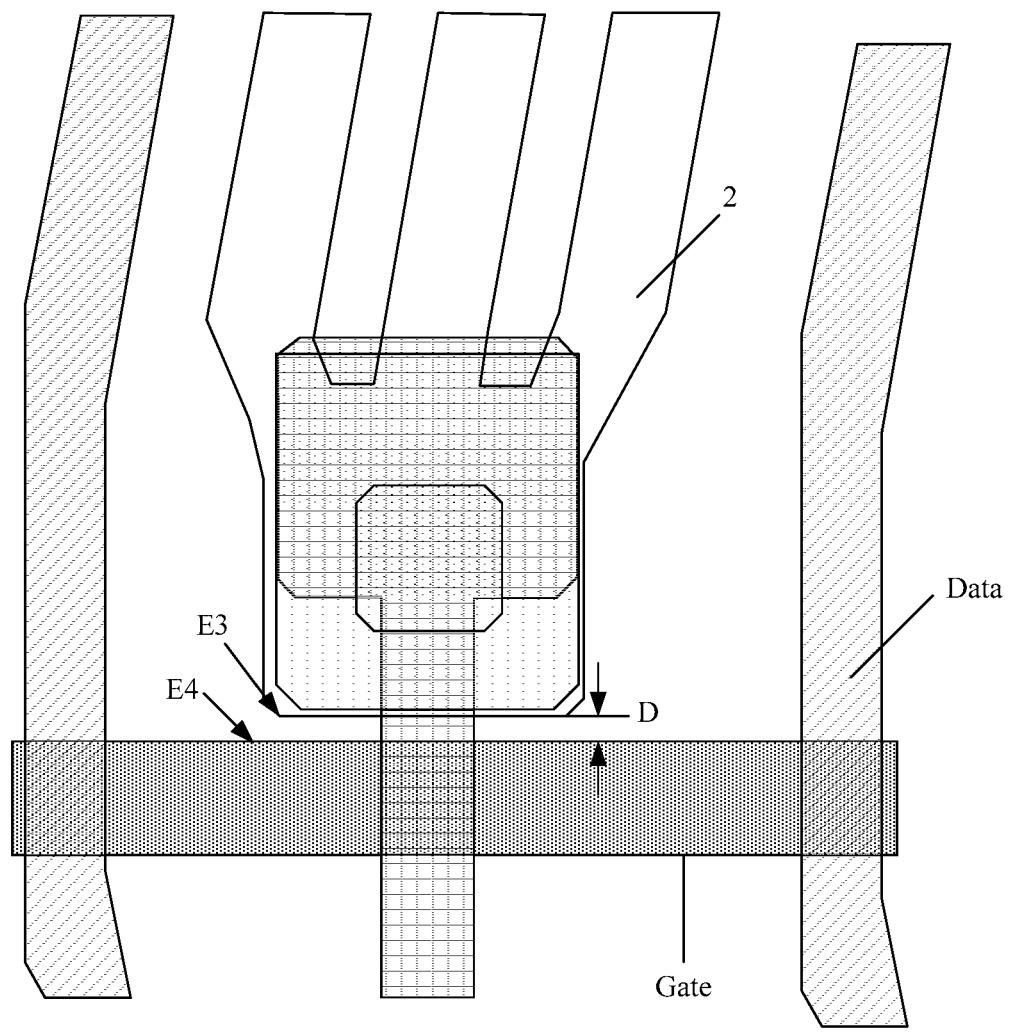
FIG. 11 is a schematic structural diagram of another display panel according to an embodiment of the present disclosure.

FIG. 11 is a schematic structural diagram of still another display panel according to the present disclosure. In FIG. 11, there is no overlap between the projection of the first electrode 2 of the sub-pixel and the projection of the corresponding scan line Gate on the substrate (not shown in FIG. 11). The projection of the first electrode 2 on the substrate has a third edge E3 on the side close to the corresponding scan line Gate. The projection of the gate line Gate on the substrate has a fourth edge E4 on the side close to the first electrode. The distance between the third edge E3 and the fourth edge E4 is a second adjustment distance D. The sub-pixel having a smaller area of the opening region corresponds to a greater value of the second adjustment distance. In this embodiment, the first electrode is a pixel electrode of a sub-pixel.

Figure 12:
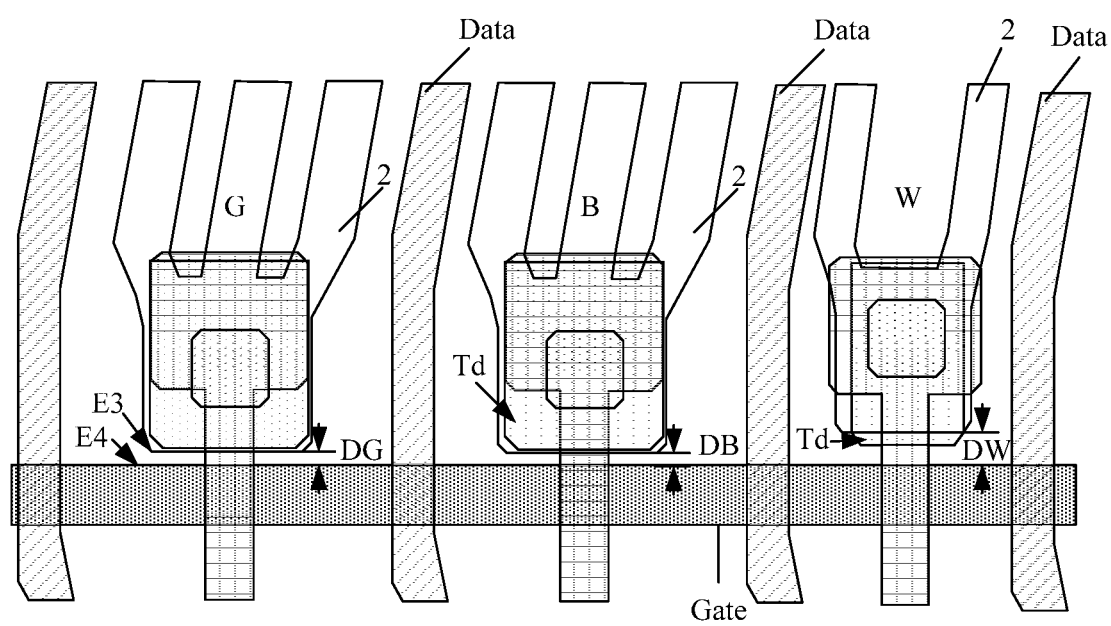
FIG. 12 is a schematic structural diagram of another display panel according to the present disclosure.

In this embodiment, for the RGBW pixel structure as shown in FIG. 12, the second adjustment distance DW of the sub-pixel (such as the white sub-pixel W) having a small opening region is greater than the second adjustment distance (e.g., the second adjustment distance DG or DB of the green sub-pixel G or the blue sub-pixel B) of the sub-pixel having a large opening region. In this embodiment, the green sub-pixel G and the blue sub-pixel B have the same area of the opening region, and have the same second adjustment distance, i.e. DG=DB.

That is, in the embodiment, by adjusting the value of the second adjustment distance, the edge capacitance between the pixel electrode of the sub-pixel having a small opening region and the corresponding scan line is smaller than the edge capacitance between the pixel electrode of the sub-pixel having a large opening region and the corresponding scan line, such that the sub-pixel having a large opening region and the sub-pixel having a small opening region have the same optimal common electrode voltage Vcom, thereby improving the electrical stability of all the sub-pixels of the display panel and improving the display effect of the display panel.

It should be noted that, in this embodiment, the specific manner of adjusting the value of the second adjustment distance is not limited, which may be implemented by adjusting the position of the scan line, or by adjusting the position of the pixel electrode. If a position of the scan line of a single sub-pixel is moved, the position of the scan line of other sub-pixels in the same row is affected, so that the second adjustment distances of multiple sub-pixels have to be adjusted. In order to avoid this situation, in an embodiment, the second adjustment distance is adjusted by moving the position of the pixel electrode of the sub-pixel.

In an embodiment of the present disclosure, the projection of the pixel electrode and the projection of the corresponding scan line on the substrate have an overlapping region. The sub-pixel having a smaller area of the opening region corresponds to a smaller area of the overlapping region.

Figure 13:
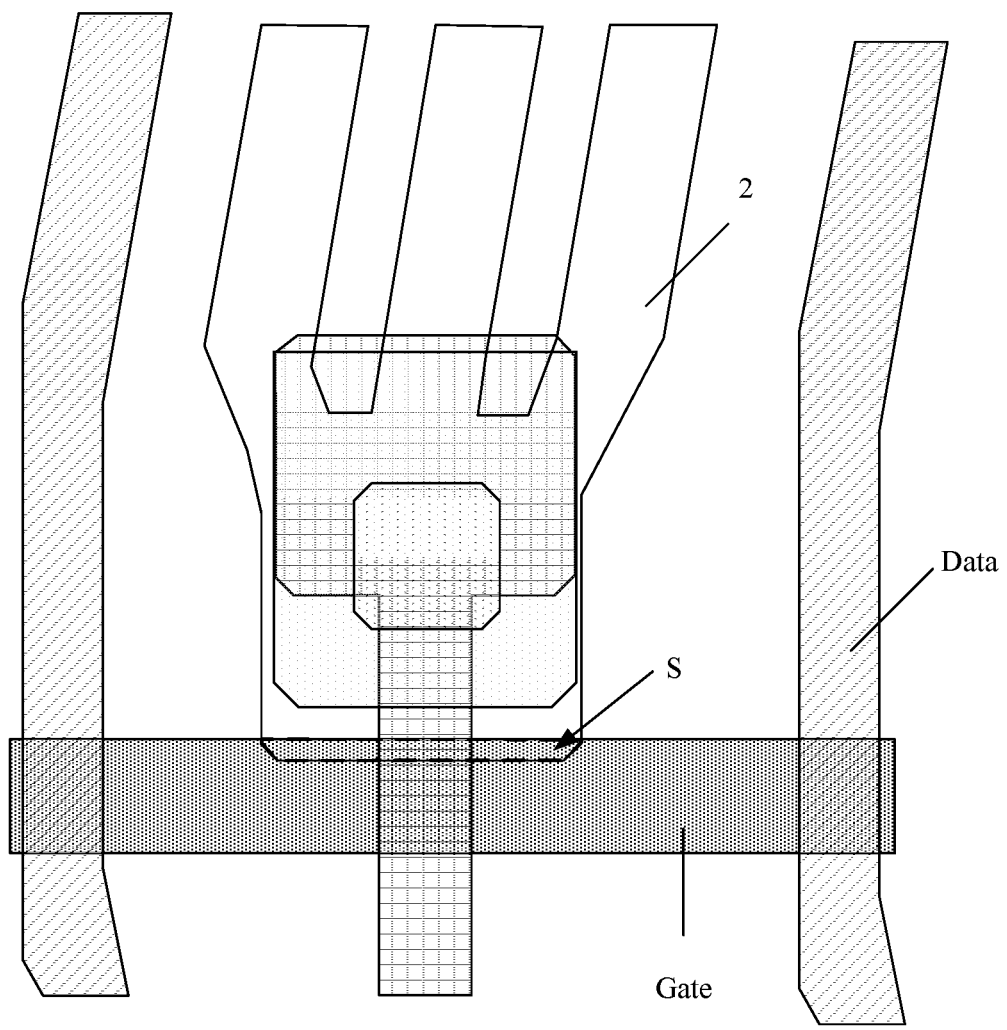
FIG. 13 is a schematic structural diagram of another display panel according to an embodiment of the present disclosure.
Figure 14:
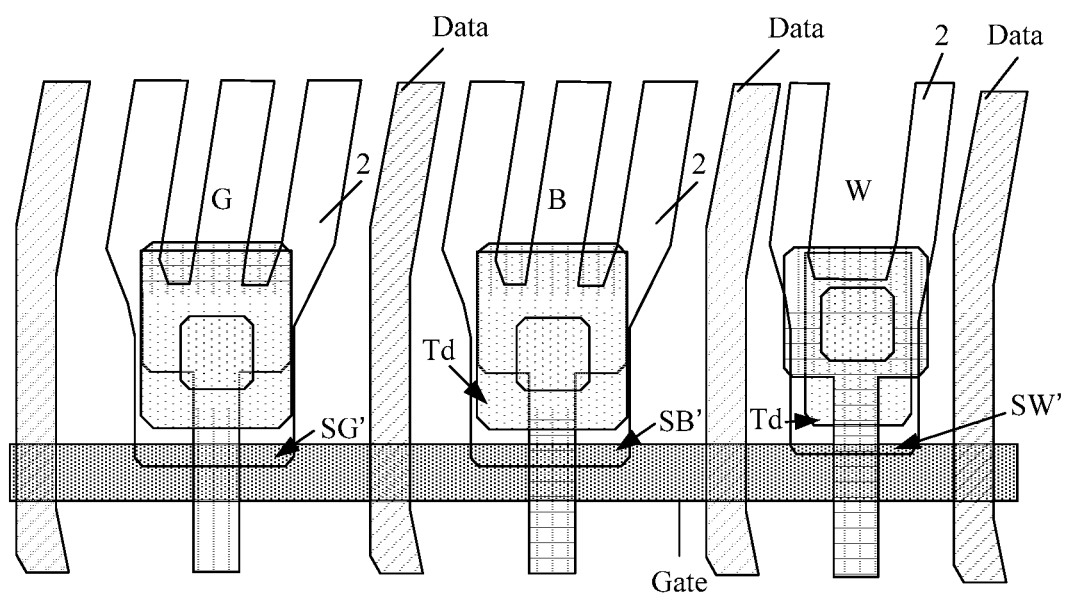
FIG. 14 is a schematic structural diagram of a display panel according to an embodiment of the present disclosure.

FIG. 13 is a schematic structural diagram of still another display panel according to the present disclosure, in which there is an overlapping region between the projection of the pixel electrode 2 of the sub-pixel and the projection of the corresponding scan line Gate on the substrate. A plane capacitor is formed between the pixel electrode and the corresponding scan line in the overlapping portion. Referring to the RGBW pixel structure shown in FIG. 14, the area of the overlapping region of the sub-pixel having a small opening region (such as the overlapping region SW' of the white sub-pixel W) is smaller than the area of the overlapping region of the sub-pixel having a large opening region (such as the overlapping region SG' or SB' of the green sub-pixel G or the blue sub-pixel B). In this embodiment, the green sub-pixel G and the blue sub-pixel B have the same area of the opening region, and have the same area of the overlapping region, i.e., SG'=SB'.

That is, in the embodiment, by adjusting the value of the plane capacitance formed by the overlapping region, the plane capacitance between the pixel electrode of the sub-pixel having a small opening region and the corresponding scan line is smaller than the plane capacitance between the pixel electrode of the sub-pixel having a large opening region and the corresponding scan line, such that the sub-pixel having a large opening region and the sub-pixel having a small opening region have the same optimal common electrode voltage Vcom, thereby improving the electrical stability of all the sub-pixels of the display panel and improving the display effect of the display panel.

It should be noted that, in this embodiment, the specific manner of adjusting the area of the overlapping region is not limited, which may be implemented by adjusting the position of the scan line, or by adjusting the position of the pixel electrode. If a position of the scan line of a single sub-pixel is move, the position of the scan line of other sub-pixels in the same row is affected, so that the areas of the overlapping regions of multiple sub-pixels have to be adjusted. In order to avoid this situation, in an embodiment, the area of the overlapping region is adjusted by moving the position of the pixel electrode of the sub-pixel.

In this embodiment, the first electrode 2 is a pixel electrode. Referring to FIG. 5 or FIG. 6, each sub-pixel further includes a second electrode 2', that is, a common electrode. In this embodiment, the relative position of the second electrode and the first electrode is not limited. In an embodiment, the second electrode 2' may be located directly below the first electrode 2, and is in a whole layer structure, that is, the common electrodes of all the sub-pixels are located in the same layer, and are electrically connected to each other to have the same common electrode voltage Vcom. Referring to FIG. 5, the drain 5 in all the above embodiments of the present disclosure is disposed in a second metal layer of the display panel, and the scan line 3 is located in a first metal layer of the display panel. As shown in FIG. 6, the data line 6 is also disposed in the second metal layer. The drain 5 in the second metal layer is electrically connected to the first electrode 2 through a via hole in the planarization layer 4.

In this embodiment, the area of the opening region determines the storage capacitance between the first electrode and the second electrode. In another embodiment, the area of the opening region determines the area of the first electrode corresponding to the sub-pixel. In this embodiment, the first electrode may be multiple strip electrodes, and the sub-pixel having a larger area of the opening region corresponds to a larger number of strip electrodes in the first electrode of the sub-pixel. That is, the sub-pixel having a large opening region has a large number of pixel electrodes, and the sub-pixel having a small opening region has a small number of pixel electrodes. Referring to FIGS. 1, 7, 8, 9, 11 and 13, the area of the opening region of the white sub-pixel W is smaller than that of other sub-pixels (RGB), and the number of pixel electrodes of the white sub-pixel W is smaller than the number of pixel electrodes of other sub-pixels (RGB). In other embodiments of the present disclosure, the pixel electrode may have other shapes, which is not limited in this embodiment.

It should be noted that the embodiment of the present disclosure does not limit the number of pixels in each pixel unit, the area of the opening region and the arrangement of the sub-pixels.

In an embodiment of the present disclosure, each pixel unit may include four sub-pixels, and among the four sub-pixels, the area of the opening region of one sub-pixel is less than the areas of the opening regions of the other sub-pixels. Alternatively, the areas of the opening regions of two sub-pixels may be the same and smaller than the areas of the opening regions of the other sub-pixels.

Figure 15:
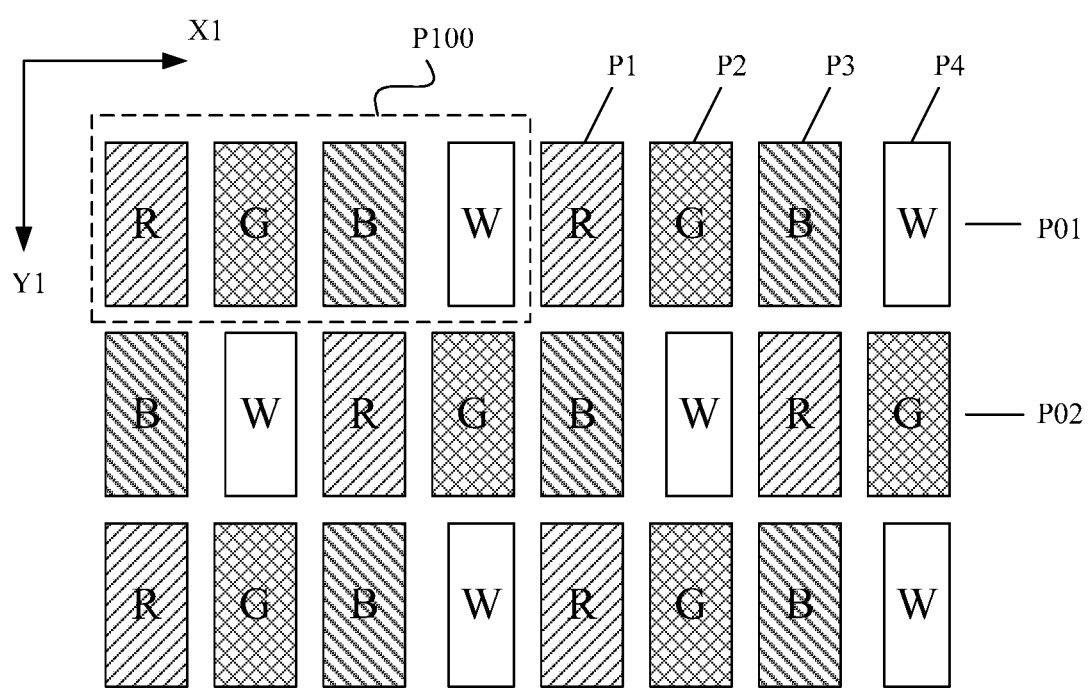
FIG. 15 shows a structure of a sub-pixel arrangement according to an embodiment of the present disclosure.

As shown in FIG. 15, a sub-pixel arrangement is provided in an embodiment of the present disclosure, in which each pixel unit P100 includes four sub-pixels, and among the four sub-pixels, the area of the opening region of one sub-pixel is less than the area of the opening region of the other sub-pixels. The four sub-pixels include a first sub-pixel P1, a second sub-pixel P2, a third sub-pixel P3 and a fourth sub-pixel P4. The first sub-pixel P1, the second sub-pixel P2 and the third sub-pixel P3 have the same area of the opening region, and the area of the opening region of the fourth sub-pixel P4 is less than the area of the opening region of the first sub-pixel P1. In this embodiment, the colors of the four sub-pixels are not limited. In an embodiment of the present disclosure, the first sub-pixel P1 is a red sub-pixel G, the second sub-pixel P2 is a green sub-pixel G, the third sub-pixel P3 is a blue sub-pixel B, and the fourth sub-pixel P4 is a white sub-pixel W. The arrangement of the sub-pixels on the display panel is shown in FIG. 15, in which a first sub-pixel row P01 and a second sub-pixel row P02 are alternately repeated in a first direction Y1. The first sub-pixel row P01 includes repeated sequences of the first sub-pixel P1, the second sub-pixel P2, the third sub-pixel P3 and the fourth sub-pixel P4 along a second direction X1, and the second sub-pixel row P02 includes repeated sequences of the third sub-pixel P3, the fourth sub-pixel P4, the first sub-pixel P1 and the second sub-pixel P2 along the second direction X1. The first direction Y1 is an extending direction of the data lines, and the second direction X1 is an extending direction of the scan lines.

In design, the sub-pixels having different areas of the opening region may have the same common electrode voltage Vcom by adjusting the adjustment capacitance. It may be realized by adjusting the distance between the drain and/or the pixel electrode and the scan line, or adjusting the area of the overlapping region between the drain and/or the pixel electrode and the scan line. It is found that there is an edge capacitance between two different metal layers having non-overlapping projections on the substrate, and the value of the edge capacitance varies with the distance between the two metal layers. That is, a large distance leads to a small edge capacitance. There is a plate capacitance between two metal layers having overlapping projections, and the value of the plate capacitance varies with the area of the overlapping region. A large area of the overlapping region leads to a large plate capacitance. Usually, the edge capacitance is smaller than the plate capacitance.

Table 1 shows the relationship between the first adjustment distance (or the second adjustment distance) L between the drain (or first electrode) and the scan line and the edge capacitance Cpg according to the present disclosure. It can be seen from the data obtained by the simulation that the edge capacitance Cpg increases as the distance L decreases. It should be noted that the data in the table is only actual measurement data of a certain display panel, which only illustrates the trend of the change of the edge capacitance with distance, and does not indicate the quantitative relationship between the edge capacitance and the distance of all the display panels.

TABLE 1

Relationship between L and edge capacitance Cpg

| | L | | | |
|---|---|---|---|---|
| | 1.25 (Por) | 0.25 | 0 | −0.25 |
| Cpg (fF) | 1.00 | 1.22 | 1.41 | 1.52 |

Based on the above analysis, it can be known that in this embodiment, the value of the capacitance Cpg may be adjusted by adjusting the first adjustment distance (or the second adjustment distance) L between the drain (or the first electrode) and the scan line, thereby achieving the purpose of adjusting the optimal common electrode voltage Vcom of the sub-pixel.

In one embodiment of the present disclosure, the sub-pixels having different areas of the opening region may have the same optimal common electrode voltage Vcom by adjusting the edge capacitance of the sub-pixel having a small opening region and the plate capacitance of the sub-pixel having a large opening region.

Figure 16:
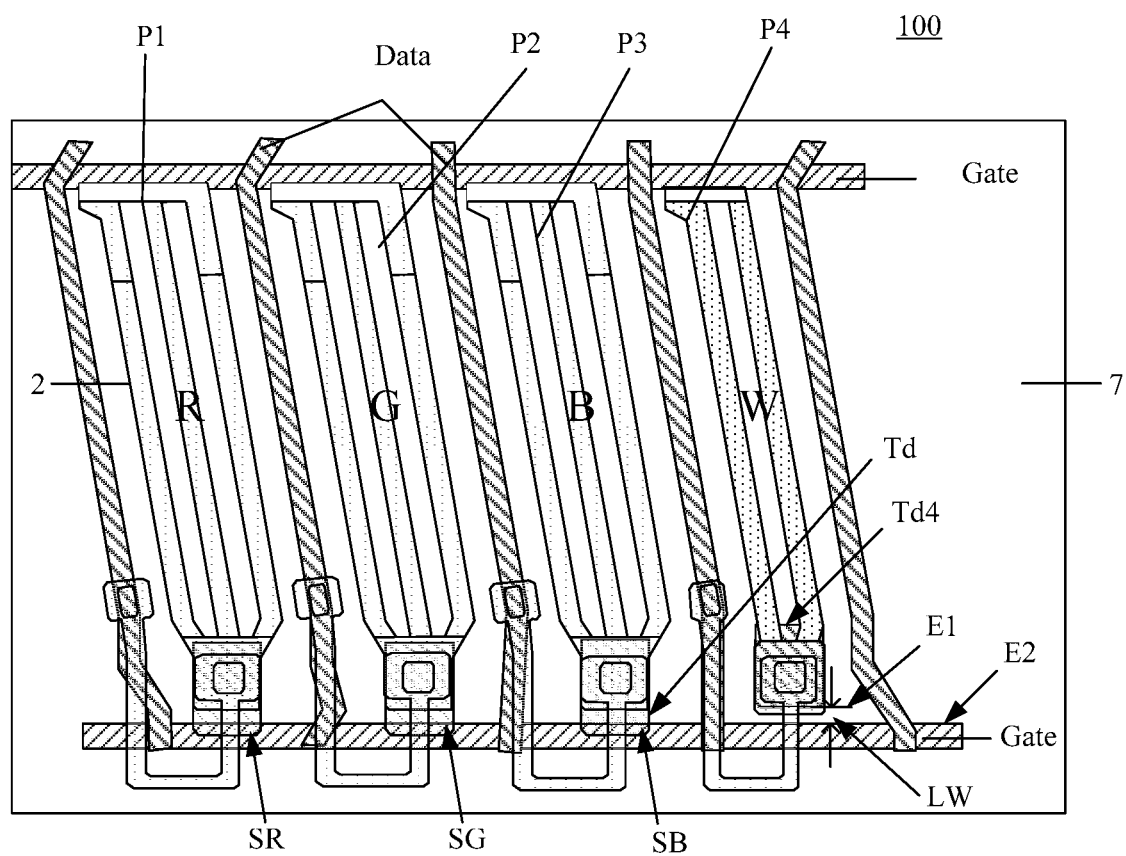
FIG. 16 is a schematic structural diagram of a display panel corresponding to the sub-pixel arrangement shown in FIG. 15.

FIG. 16 is a schematic structural diagram of a display panel according to another embodiment of the present disclosure. The drain of the thin film transistor of the fourth sub-pixel, i.e., the white sub-pixel W, is a fourth drain Td4. There is no overlap between the projection of the fourth drain Td4 and the projection of the corresponding scan line Gate on the substrate 7, the projection of the fourth drain Td4 on the substrate 7 has a first edge E1 on a side close to the corresponding scan line Gate, and the projection of the scan line Gate on the substrate 7 has a second edge E2 on a side close to the fourth drain Td4. The distance between the first edge E1 and the second edge E2 is a first adjustment distance LW. The projections of the drains Td of the thin film transistors of the first sub-pixel R, the second sub-pixel G and the third sub-pixel B and/or the projections of the first electrodes 2 of the first sub-pixel R, the second sub-pixel G and the third sub-pixel B on the substrate 7 each have an overlapping region with the projection of the corresponding scan line Gate on the substrate 7. FIG. 16 illustrates an example that there is an overlap between the drain Td and the scan line Gate. As shown in FIG. 16, the drains Td of the first sub-pixel R, the second sub-pixel G and the third sub-pixel B respectively have overlapping regions SR, SB and SG with the scan line Gate. The case where the first electrode 2 overlaps with the scan line Gate is similar to the case where the drain Td overlaps with the scan line Gate, which will not be described in detail in this embodiment.

In another embodiment of the present disclosure, in a pixel unit including four sub-pixels, the four sub-pixels may be divided into two groups, and the areas of the opening regions of two sub-pixels in a same group are the same. The area of the opening region of sub-pixels in one group is less than the area of the opening region of sub-pixels in the other group.

Figure 17:
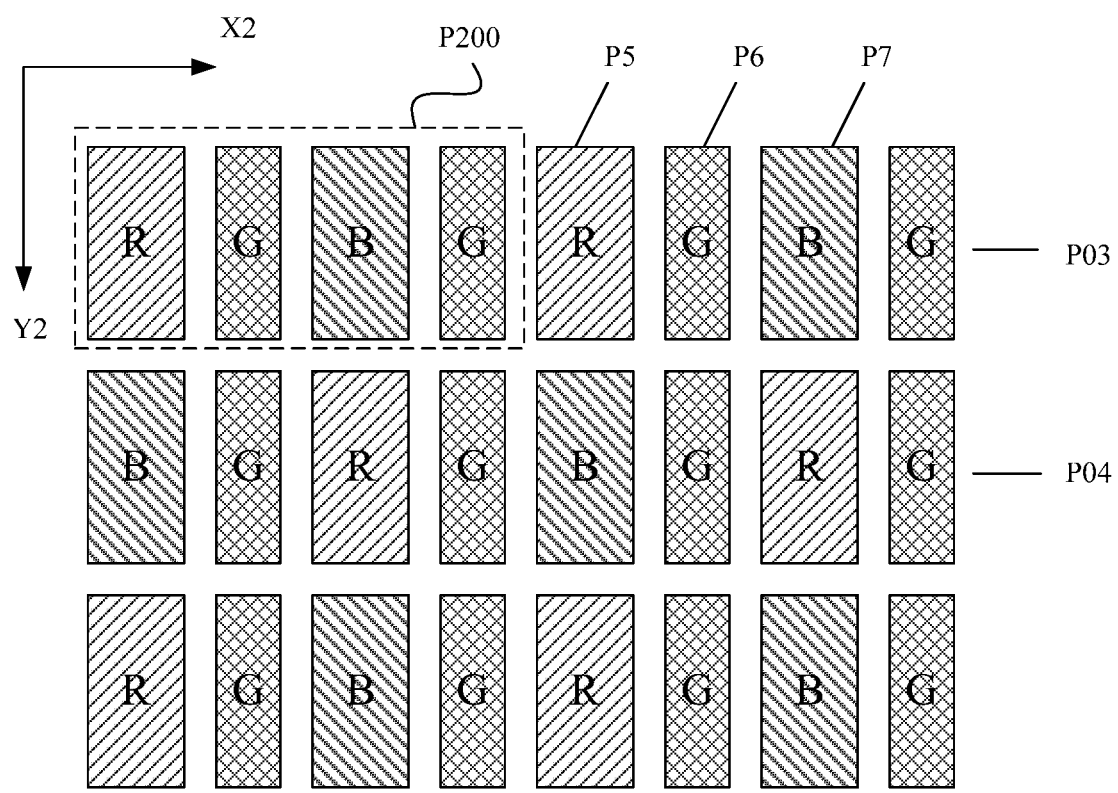
FIG. 17 shows a structure of another sub-pixel arrangement according to an embodiment of the present disclosure.

As shown in FIG. 17, another sub-pixel arrangement structure is provided in an embodiment of the present disclosure, in which each pixel unit P200 includes: a fifth sub-pixel P5, two sixth sub-pixels P6, and a seventh sub-pixel P7. The fifth sub-pixel P5 and the seventh sub-pixel P7 have the same area of the opening region, and the area of the opening region of the sixth sub-pixel P6 is less than the area of the opening region of the fifth sub-pixel P5. In this embodiment, the color of each of the four sub-pixels is not limited. In an embodiment of the present disclosure, the fifth sub-pixel P5 is a red sub-pixel R, the sixth sub-pixel P6 is a green sub-pixel G, and a seventh sub-pixel P7 is a blue sub-pixel B. The arrangement of the sub-pixels on the display panel is shown in FIG. 17. A third sub-pixel row P03 and a fourth sub-pixel row P04 are alternately repeated along a third direction Y2. The third sub-pixel row P03 includes repeated sequences of the fifth sub-pixel P5, the sixth sub-pixel P6, the seventh sub-pixel P7 and the sixth sub-pixel P6 along a fourth direction X2, and the fourth sub-pixel row P04 includes repeated sequences of the seventh sub-pixel P7, the sixth sub-pixel P6, the fifth sub-pixel P5 and the sixth sub-pixel P6 along the fourth direction X2. The third direction Y2 is an extending direction of the data lines, and the fourth direction X2 is an extending direction of the scan lines.

The edge capacitance is usually smaller than the plate capacitance. In an embodiment of the present disclosure, the edge capacitance of the sub-pixel having a small opening region and the plate capacitance of the sub-pixel having a large opening region may be adjusted to realize the same optimal common electrode voltage Vcom of the sub-pixels having different areas of the opening regions.

Figure 18:
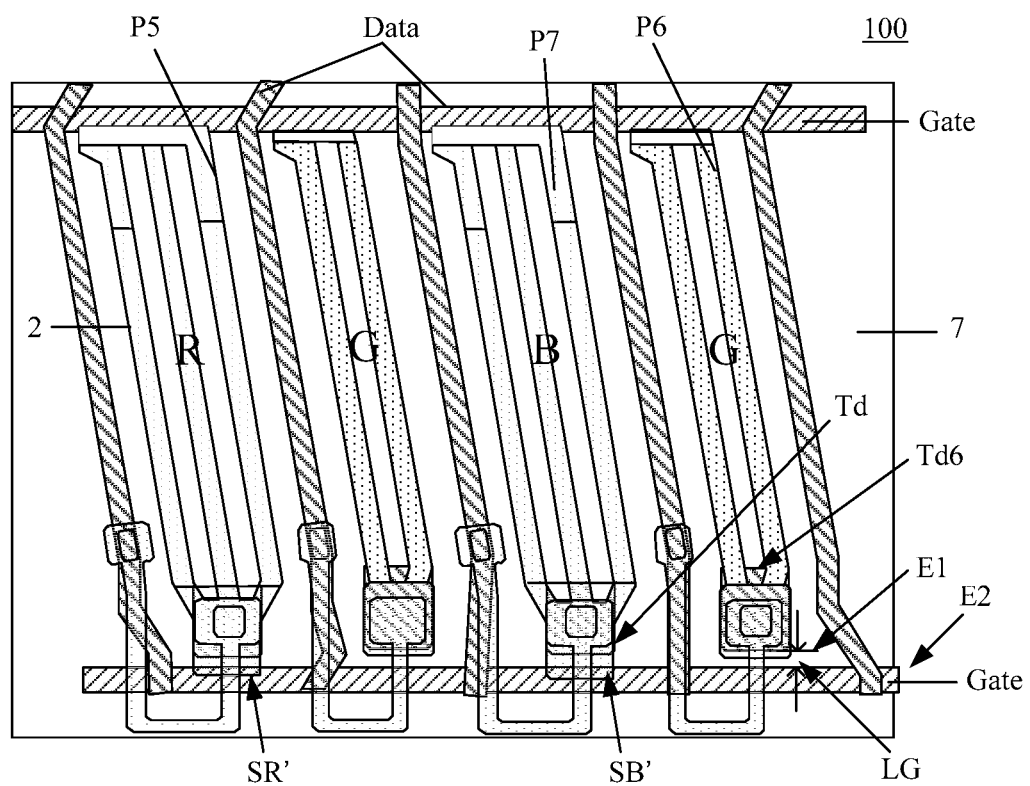
FIG. 18 is a schematic structural diagram of a display panel corresponding to the sub-pixel arrangement shown in FIG. 17.

FIG. 18 is a schematic structural diagram of another display panel according to an embodiment of the present disclosure. The drain of the thin film transistor of the sixth sub-pixel G is a sixth drain Td6. There is no overlap between the projection of the sixth drain Td6 and the projection of the corresponding scan line Gate on the substrate 7. The projection of the sixth drain Td6 on the substrate 7 has a first edge E1 on a side close to the corresponding scan line Gate, and the projection of the scan line Gate on the substrate 7 has a second edge E2 on a side close to the sixth drain Td6. The distance between the first edge E1 and the second edge E2 is a first adjustment distance LG The projections of the drains of the thin film transistors of the fifth sub-pixel R and the seventh sub-pixel B and/or the projections of the first electrodes 2 of the fifth sub-pixel R and the seventh sub-pixel B on the substrate each have an overlapping region with the projection of the corresponding scan line Gate on the substrate 7, as shown in SW and SB' in FIG. 18. The case where the drain Td overlaps with the scan line Gate is similar to the case where the first electrode 2 overlaps with the scan line Gate, which will not be described in detail in this embodiment.

Figure 19:
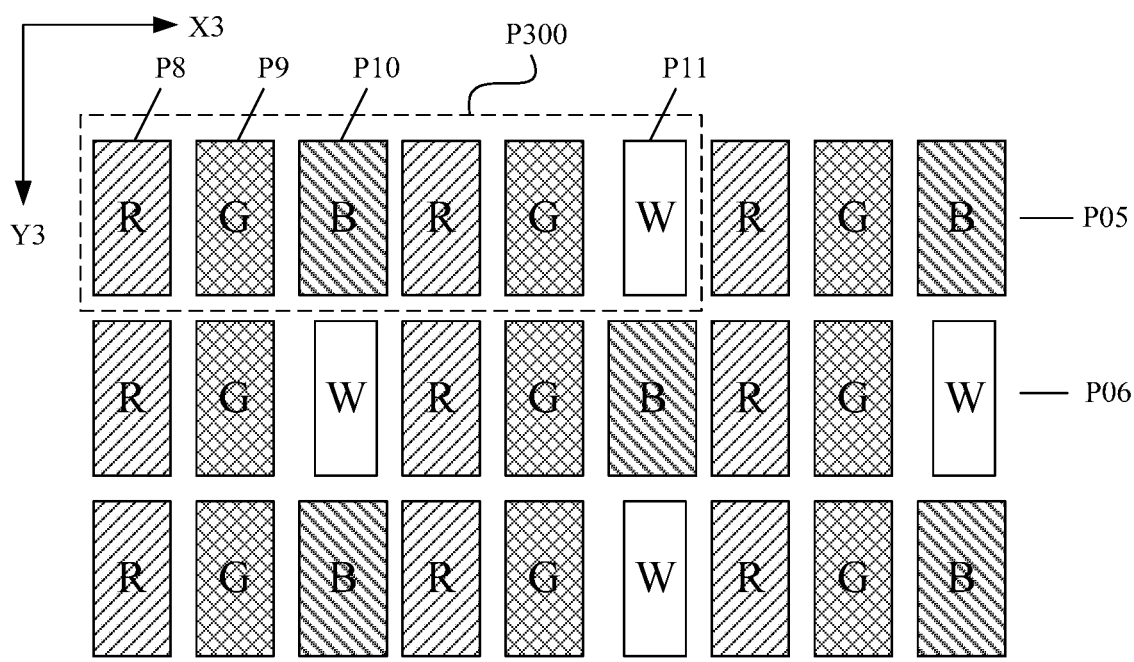
FIG. 19 shows a structure of another sub-pixel arrangement according to an embodiment of the present disclosure.

In another embodiment of the present disclosure, as shown in FIG. 19, which shows still another sub-pixel arrangement structure according to an embodiment of the present disclosure, each pixel unit P300 includes six sub-pixels, and the relationship of the areas of the opening regions of the six sub-pixels is not limited in this embodiment. In an embodiment, four sub-pixels have the same area of the opening region, one sub-pixel has an opening region larger than the opening region of the four sub-pixels, and one sub-pixel has an opening region smaller than the opening region of the four sub-pixels.

In one embodiment, the six sub-pixels in each pixel unit includes two eighth sub-pixels P8, two ninth sub-pixels P9, one tenth sub-pixel P10 and one eleventh sub-pixel P11. The eighth sub-pixel P8 and the ninth sub-pixel P9 have the same area of the opening region. The opening region of the tenth sub-pixel P10 is larger than the opening region of the eighth sub-pixel P8. The opening region of the eleventh sub-pixel P11 is smaller than the opening region of the eighth sub-pixel P8.

The arrangement of the six sub-pixels on the display panel is not limited. In an embodiment, a fifth sub-pixel row and a sixth sub-pixel row are alternately repeated along a fifth direction. The fifth sub-pixel row includes repeated sequences of the eighth sub-pixel P8, the ninth sub-pixel P9, the tenth sub-pixel P10, the eighth sub-pixel P8, the ninth sub-pixel P9 and the eleventh sub-pixel P11 along a sixth direction. The sixth sub-pixel row includes repeated sequences of the eighth sub-pixel P8, the ninth sub-pixel P9, the eleventh sub-pixel P11, the eighth sub-pixel P8, the ninth sub-pixel P9 and the tenth sub-pixel P10 along the sixth direction. The fifth direction is an extending direction of the data lines, and the sixth direction is an extending direction of the scan lines.

The edge capacitance is usually smaller than the plate capacitance. In an embodiment of the present disclosure, the edge capacitance of the sub-pixel having a small opening region and the plate capacitance of the sub-pixel having a large opening region may be adjusted to realize the same optimal common electrode voltage Vcom of the sub-pixels having different areas of the opening regions.

Therefore, in an embodiment of the present disclosure, the same optimal common electrode voltage Vcom for all the sub-pixels may be realized by adjusting the edge capacitance of the eleventh sub-pixel P11 and adjusting the plate capacitances of the eighth sub-pixel P8, the ninth sub-pixel P9 and the tenth sub-pixel P10.

Figure 20:
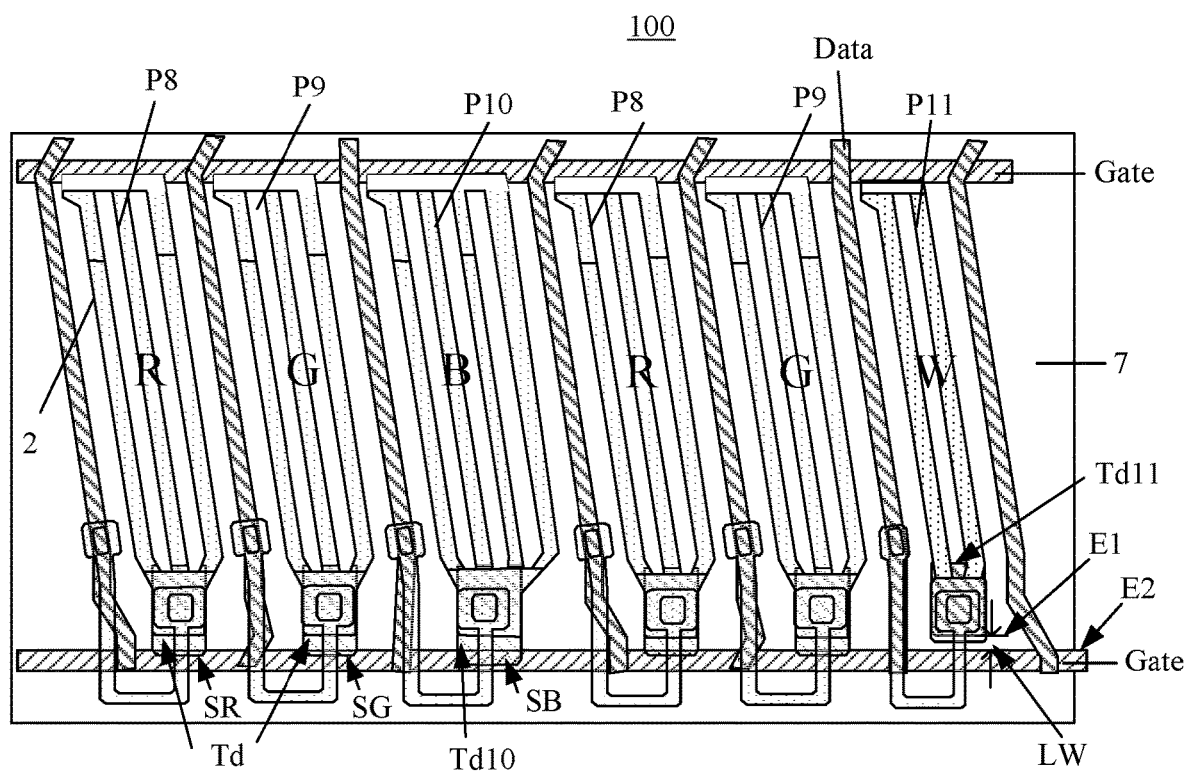
FIG. 20 to FIG. 22 are schematic structural diagrams of different display panels corresponding to the sub-pixel arrangement shown in FIG. 19.

FIG. 20 is a schematic structural diagram of a display panel according to an embodiment of the present disclosure.

The drain of the thin film transistor of the eleventh sub-pixel W is an eleventh drain Td11. There is no overlap between the projection of the eleventh drain Td11 and the projection of the corresponding scan line Gate on the substrate 7. The projection of the eleventh drain Td11 on the substrate 7 has a first edge E1 on a side close to the corresponding scan line Gate, and the projection of the scan line Gate on the substrate 7 has a second edge E2 on a side close to the eleventh drain Td11. The distance between the first edge E1 and the second edge E2 is a third adjustment distance LW. The projection of the drain Td 10 of the thin film transistor of the tenth sub-pixel B and/or the projection of the first electrode 2 of the tenth sub-pixel B on the substrate 7 each have a first overlapping region SB with the projection of the corresponding scan line Gate on the substrate 7. The projections of the drains Td 10 of the thin film transistors of the eighth sub-pixel R and the ninth sub-pixel G and/or the projections of the first electrodes 2 of the eighth sub-pixel R and the ninth sub-pixel G on the substrate 7 each have a second overlapping region (SR and SG) with the projection of the corresponding scan line Gate on the substrate 7. The area of the second overlapping region (SR and SG) is less than the area of the first overlapping region SB. In the embodiment, the drain Td and the scanning line Gate are taken as an example. The case where the first electrode 2 overlaps the scan line Gate is similar to the case where the drain Td overlaps with the scan line, which will not be described in detail in this embodiment.

In another embodiment of the present disclosure, all sub-pixels may have the same optimal common electrode voltage Vcom by adjusting the edge capacitances of the eleventh sub-pixel, the eighth sub-pixel and the ninth sub-pixel, and adjusting the plate capacitance of the tenth sub-pixel.

Figure 21:
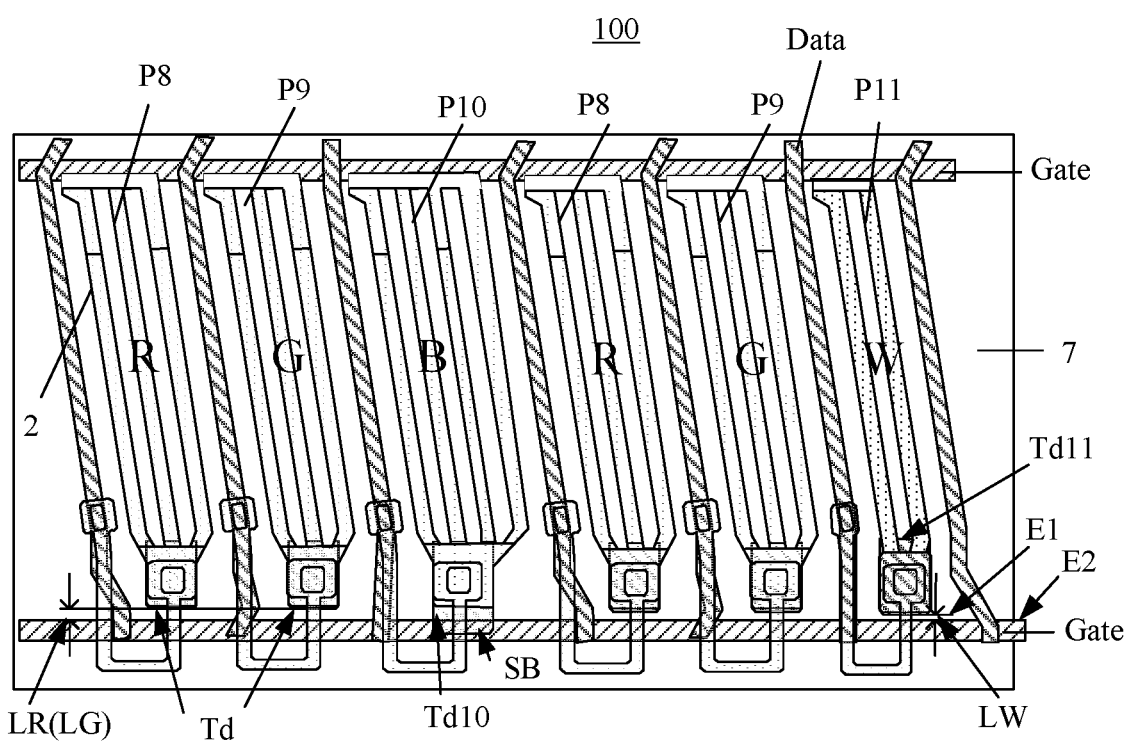

FIG. 21 is a schematic structural diagram of a display panel according to an embodiment of the present disclosure. The drain of the thin film transistor of the eleventh sub-pixel W is an eleventh drain Td11. There is no overlap between the projection of the eleventh drain Td11 and the projection of the corresponding scan line Gate on the substrate 7. The projection of the eleventh drain Td11 on the substrate 7 has a first edge E1 on a side close to the corresponding scan line Gate, and the projection of the scan line Gate on the substrate 7 has a second edge E2 on a side close to the eleventh drain Td11. The distance between the first edge E1 and the second edge E2 is a third adjustment distance LW. The projection of the drain Td 10 of the thin film transistor of the tenth sub-pixel B and/or the projection of the first electrode 2 of the tenth sub-pixel B on the substrate 7 each have a first overlapping region SB with the projection of the corresponding scan line Gate on the substrate 7.

The drain of the thin film transistor of the eighth sub-pixel R is an eighth drain Td8. There is no overlap between the projection of the eighth drain Td8 and the projection of the corresponding scan line Gate on the substrate 7. The projection of the eighth drain Td8 on the substrate 7 has a first edge E1 on a side close to the corresponding scan line Gate, and the projection of the scan line Gate on the substrate 7 has a second edge E2 on a side close to the eighth drain Td8. The distance between the first edge E1 and the second edge E2 is a fourth adjustment distance LR. The drain of the thin film transistor of the ninth sub-pixel G is an ninth drain Td. There is no overlap between the projection of the ninth drain Td and the projection of the corresponding scan line Gate on the substrate 7. The projection of the ninth drain Td on the substrate 7 has a first edge E1 on a side close to the corresponding scan line Gate, and the projection of the scan line Gate on the substrate 7 has a second edge E2 on a side close to the ninth drain Td. The distance between the first edge E1 and the second edge E2 is a fourth adjustment distance LG=LR. The fourth adjustment distance LR is greater than the third adjustment distance LW.

The projection of the drain Td10 of the thin film transistor of the tenth sub-pixel B and/or the projection of the first electrode 2 of the tenth sub-pixel B on the substrate 7 each have a first overlapping region SB with the projection of the corresponding scan line Gate on the substrate 7.

Figure 22:
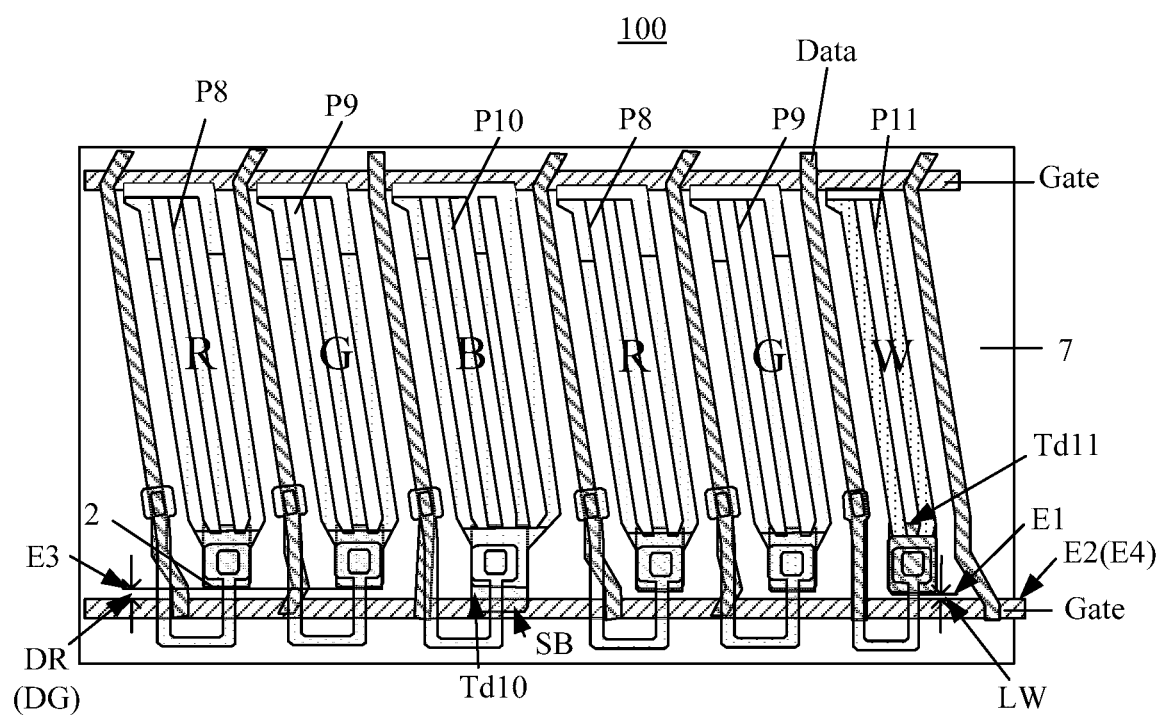

Alternatively, referring to FIG. 22, which is a schematic structural diagram of a display panel according to an embodiment of the present disclosure, the configuration of the eleventh sub-pixel and the tenth sub-pixel is the same as that shown in FIG. 21 above, and the difference lies in that the projections of the first electrodes 2 of the eighth sub-pixel R and the ninth sub-pixel G do not overlap the projection of the corresponding scan line Gate on the substrate 7, the projection of the first electrode 2 on the substrate 7 has a third edge E3 on a side close to the corresponding scan line Gate, and the projection of the scan line Gate on the substrate 7 has a fourth edge E4 (also E2) on a side close to the first electrode 2. The distance between the third edge E3 and the fourth edge E4 is a fifth adjustment distance DR (or DG), where the fifth adjustment distance DR is greater than the third adjustment distance LW.

The color of each sub-pixel is not limited. In order to make the display panel display color in balance, in an embodiment, the white sub-pixel has a small opening region, the eighth sub-pixel P8 is a red sub-pixel R, the ninth sub-pixel P9 is a green sub-pixel G, the tenth sub-pixel P10 is a blue sub-pixel B, and the eleventh sub-pixel P11 is a white sub-pixel W.

The display panel according to the present disclosure includes multiple pixel units. In each of the pixel units, the area of the opening region of at least one sub-pixel is different from the area of the opening region of other sub-pixels. There is an adjustment capacitance between the drain of the thin film transistor and/or the first electrode in each sub-pixel and the scan line corresponding to the sub-pixel, and the sub-pixel having a smaller area of the opening region corresponds to a smaller value of the adjustment capacitance. By adjusting the values of the adjustment capacitances corresponding to the sub-pixels with different areas of opening regions such that the optimal Vcom of all the sub-pixels is the same, all the sub-pixels operate under the same optimal Vcom, improving the electrical stability of the display panel, so as to make no sub-pixel flicker, thereby improving the display effect of the display panel.

It should be noted that, in each sub-pixel, the relationship of the adjustment capacitance Cpg with the area of the overlapping region between the drain and/or the first electrode and the corresponding scan line, the first adjustment distance or the second adjustment distance is not a simple linear relationship. Therefore, the relationship of the adjustment capacitance Cpg with the above-mentioned area of the overlapping region, the first adjustment distance or the second adjustment distance may be obtained by simulation, thereby making a design according to actual needs.

In another embodiment of the present disclosure, a display device including a display panel is provided.

Figure 23:
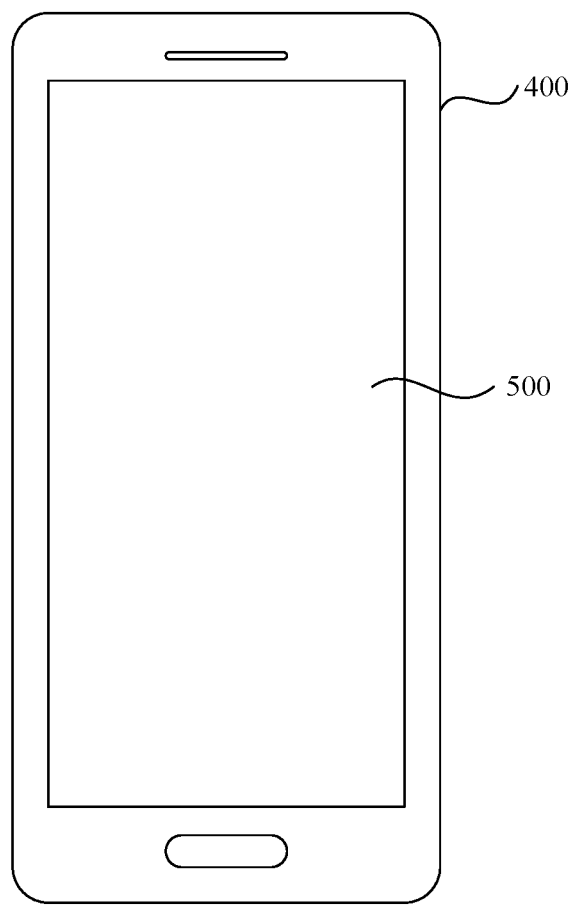
FIG. 23 is a schematic diagram of a display device according to an embodiment of the present disclosure.

FIG. 23 is a schematic diagram of a display device according to an embodiment of the present disclosure. Referring to FIG. 23, the display device 400 includes a display panel 500. The display panel 500 is the display panel according to any embodiment of the present disclosure. The display device may be a mobile phone as shown in the figure, and may also be a computer, a television set, a smart wearable display device, which is not limited in this embodiment.

Since the display device includes the above-mentioned display panel, the electrical stability of the display device can also be improved, so as to have a better display effect.

It should also be noted that, in this context, relational terms such as first and second, etc. are used merely to distinguish one entity or operation from another entity or operation, without necessarily requiring or implying that there is any such actual relationship or order between such entities or operations. Furthermore, the terms "comprise", "include" or any other variations intend to cover non-exclusive inclusions, so that an item or device including a series of elements not only includes such elements, but also other elements unlisted definitely, or further includes the elements that are inherent to such an item or device. In the case without more limitations, an element defined by the phrase "comprising a . . . " does not exclude the presence of additional identical elements in the item or device including the above elements.

The invention claimed is:

1. A display panel, comprising:
a substrate; and
a plurality of scan lines and a plurality of data lines located on the substrate, wherein
the plurality of scan lines intersect and are insulated from the plurality of data lines, to define a plurality of sub-pixels in a matrix, a plurality of adjacent sub-pixels form a pixel unit,
each of the sub-pixels comprises an opening region, each of the sub-pixels is connected to a thin film transistor, and each thin film transistor is connected to one of the scan lines,
the thin film transistor comprises a gate connected to the scan line, and a drain and a source on a side of the gate facing away from the substrate;
each of the sub-pixels comprises a first electrode located on a side of the thin film transistor facing away from the substrate, the first electrode is electrically connected to the drain;
in each pixel unit, the area of the opening region of at least one sub-pixel is different from the area of the opening region of other sub-pixels;
there is an adjustment capacitance between the drain and a corresponding scan line, and/or there is an adjustment capacitance between the first electrode and a corresponding scan line; and
the sub-pixel having a smaller area of the opening region corresponds to a smaller value of the adjustment capacitance;
wherein the first electrode includes a plurality of strip electrodes;
the sub-pixel having a larger area of the opening region corresponds to a larger number of strip electrodes in the first electrode of the sub-pixel.

2. The display panel according to claim 1, wherein, there is no overlap between a projection of the drain and a projection of the corresponding scan line on the substrate;
the projection of the drain on the substrate has a first edge on a side close to the corresponding scan line, the projection of the scan line on the substrate has a second edge on a side close to the drain, and the distance between the first edge and the second edge is a first adjustment distance; and the sub-pixel having a smaller area of the opening region corresponds to a greater value of the first adjustment distance.

3. The display panel according to claim 1, wherein,
there is an overlapping region between a projection of the drain and a projection of the corresponding scan line on the substrate; and
the sub-pixel having a smaller area of the opening region corresponds to a smaller area of the overlapping region.

4. The display panel according to claim 1, wherein
there is no overlap between a projection of the first electrode and a projection of the corresponding scan line on the substrate;
the projection of the first electrode on the substrate has a third edge on a side close to the corresponding scan line, the projection of the scan line on the substrate has a fourth edge on a side close to the first electrode, and the distance between the third edge and the fourth edge is a second adjustment distance; and
the sub-pixel having a smaller area of the opening region corresponds to a greater value of the second adjustment distance.

5. The display panel according to claim 1, wherein
there is an overlapping region between a projection of the first electrode and a projection of the corresponding scan line on the substrate; and
the sub-pixel having a smaller area of the opening region corresponds to a smaller area of the overlapping region.

6. The display panel according to claim 1, wherein the pixel unit comprises four of the sub-pixels.

7. The display panel according to claim 6, wherein in the pixel unit, the area of the opening region of one sub-pixel is less than the areas of the opening regions of other sub-pixels.

8. The display panel according to claim 7, wherein
the pixel unit comprises a first sub-pixel, a second sub-pixel, a third sub-pixel and a fourth sub-pixel;
the first sub-pixel, the second sub-pixel, and the third sub-pixel have the same area of the opening region; and
the area of the opening region of the fourth sub-pixel is less than the area of the opening region of the first sub-pixel;
the drain of the thin film transistor of the fourth sub-pixel is a fourth drain, there is no overlap between a projection of the fourth drain and a projection of the corresponding scan line on the substrate, the projection of the fourth drain on the substrate has a first edge on a side close to the corresponding scan line, the projection of the scan line on the substrate has a second edge on a side close to the fourth drain, and a distance between the first edge and the second edge is a first adjustment distance; and
the projections of the drains of the thin film transistors of the first sub-pixel, the second sub-pixel and the third sub-pixel and/or the projections of the first electrodes of the first sub-pixel, the second sub-pixel and the third sub-pixel on the substrate each have an overlapping region with the projection of the corresponding scan line on the substrate.

9. The display panel according to claim 8, wherein an arrangement of the sub-pixels on the display panel is that:
a first sub-pixel row and a second sub-pixel row are alternately repeated along a first direction;
the first sub-pixel row comprises repeated sequences of the first sub-pixel, the second sub-pixel, the third sub-pixel and the fourth sub-pixel along a second direction;
the second sub-pixel row comprises repeated sequences of the third sub-pixel, the fourth sub-pixel, the first sub-pixel and the second sub-pixel along the second direction; and
the first direction is an extending direction of the data lines, and the second direction is an extending direction of the scan lines.

10. The display panel according to claim 6, wherein in the pixel unit, the areas of the opening regions of two sub-pixels are the same, and are smaller than the areas of the opening regions of other sub-pixels.

11. The display panel according to claim 10, wherein
the pixel unit comprises one fifth sub-pixel, two sixth sub-pixels and one seventh sub-pixel;
the fifth sub-pixel and the seventh sub-pixel have the same area of the opening region, and the area of the opening region of the sixth sub-pixel is less than the area of the opening region of the fifth sub-pixel;
the drain of the thin film transistor of the sixth sub-pixel is a sixth drain, there is no overlap between a projection of the sixth drain and a projection of the corresponding scan line on the substrate, the projection of the sixth drain on the substrate has a first edge on a side close to the corresponding scan line, the projection of the scan line on the substrate has a second edge on a side close to the sixth drain, and the distance between the first edge and the second edge is a first adjustment distance; and
projections of the drains of the thin film transistors of the fifth sub-pixel and the seventh sub-pixel and/or projections of the first electrodes of the fifth sub-pixel and the seventh sub-pixel on the substrate each have an overlapping region with the projection of the corresponding scan line on the substrate.

12. The display panel according to claim 11, comprising a third sub-pixel row and a fourth sub-pixel row alternately repeated along a third direction, wherein
the third sub-pixel row comprises repeated sequences of the fifth sub-pixel, the sixth sub-pixel, the seventh sub-pixel and the sixth sub-pixel along a fourth direction;
the fourth sub-pixel row comprises repeated sequences of the seventh sub-pixel, the sixth sub-pixel, the fifth sub-pixel and the sixth sub-pixel along the fourth direction; and
the third direction is an extending direction of the data lines, and the fourth direction is an extending direction of the scan lines.

13. The display panel according to claim 1, wherein the pixel unit comprises six of the sub-pixels.

14. The display panel according to claim 13, wherein the pixel unit comprising 4 sub-pixels having the same area of the opening region, one sub-pixel having a larger opening region than the 4 sub-pixels, and one sub-pixel having a smaller opening region than the 4 sub-pixels.

15. The display panel according to claim 14, wherein
the pixel unit comprises two eighth sub-pixels, two ninth sub-pixels, one tenth sub-pixel, and one eleventh sub-pixel;
the eighth sub-pixel and the ninth sub-pixel have the same area of the opening region;
the area of the opening region of the tenth sub-pixel is greater than the area of the opening region of the eighth sub-pixel;
the area of the opening region of the eleventh sub-pixel is less than the area of the opening region of the eighth sub-pixel;

the drain of the thin film transistor of the eleventh sub-pixel is an eleventh drain, there is no overlap between a projection of the eleventh drain and a projection of the corresponding scan line on the substrate, the projection of the eleventh drain on the substrate has a first edge on a side close to the corresponding scan line, the projection of the scan line on the substrate has a second edge on a side close to the eleventh drain, and the distance between the first edge and the second edge is a third adjustment distance; and the projection of the drain of the thin film transistor of the tenth sub-pixel and/or the projection of the first electrode of the tenth sub-pixel on the substrate each have a first overlapping region with the projection of the corresponding scan line on the substrate.

16. The display panel according to claim 15, wherein projections of the drains of the thin film transistors of the eighth sub-pixel and the ninth sub-pixel and/or projections of the first electrodes of the eighth sub-pixel and the first sub-pixel on the substrate each have a second overlapping region with the projection of the corresponding scan line on the substrate; and the area of the second overlapping region is less than the area of the first overlapping region.

17. The display panel according to claim 15, wherein the drain of the thin film transistor of each of the eighth sub-pixels and each of the ninth sub-pixels is an eighth drain, there is no overlap between a projection of the eighth drain and a projection of the corresponding scan line on the substrate, the projection of the eighth drain on the substrate has a first edge on a side close to the corresponding scan line, the projection of the scan line on the substrate has a second edge on a side close to the eighth drain, and the distance between the first edge and the second edge is a fourth adjustment distance, and the fourth adjustment distance is greater than the third adjustment distance; or a projection of the first electrode of each of the eighth sub-pixels and each of the ninth sub-pixels has no overlap with the projection of the corresponding scan line on the substrate; the projection of the first electrode on the substrate has a third edge on a side close to the corresponding scan line, and the projection of the scan line on the substrate has a fourth edge on a side close to the first electrode, and the distance between the third edge and the fourth edge is a fifth adjustment distance, and the fifth adjustment distance is greater than the third adjustment distance.

18. The display panel according to claim 15, comprising:
a fifth sub-pixel row and a sixth sub-pixel row alternately repeated along a fifth direction;
the fifth sub-pixel row comprises repeated sequences of the eighth sub-pixel, the ninth sub-pixel, the tenth sub-pixel, the eighth sub-pixel, the ninth sub-pixel and the eleventh sub-pixel along a sixth direction;
the sixth sub-pixel row comprises repeated sequences of the eighth sub-pixel, the ninth sub-pixel, the eleventh sub-pixel, the eighth sub-pixel, the ninth sub-pixel and the tenth sub-pixel along the sixth direction; and
the fifth direction is an extending direction of the data lines, and the sixth direction is an extending direction of the scan lines.

19. A display device, comprising:
a display panel, wherein
the display panel comprises:
a substrate; and a plurality of scan lines and a plurality of data lines located on the substrate;
the plurality of scan lines intersect and are insulated from the plurality of data lines, to define a plurality of sub-pixels in a matrix, a plurality of adjacent sub-pixels form a pixel unit,
each of the sub-pixels comprises an opening region, each of the sub-pixels is connected to a thin film transistor, and each thin film transistor is connected to one of the scan lines,
the thin film transistor comprises a gate connected to the scan line, and a drain and a source on a side of the gate facing away from the substrate;
each of the sub-pixels comprises a first electrode located on a side of the thin film transistor facing away from the substrate, the first electrode is electrically connected to the drain;
in each pixel unit, the area of the opening region of at least one sub-pixel is different from the area of the opening region of other sub-pixels;
there is an adjustment capacitance between the drain and a corresponding scan line, and/or there is an adjustment capacitance between the first electrode and a corresponding scan line; and
the sub-pixel having a smaller area of the opening region corresponds to a smaller value of the adjustment capacitance;
wherein the first electrode includes a plurality of strip electrodes;
the sub-pixel having a larger area of the opening region corresponds to a larger number of strip electrodes in the first electrode of the sub-pixel.

* * * * *